United States Patent
Hirose et al.

[11] Patent Number: 6,122,191
[45] Date of Patent: Sep. 19, 2000

[54] SEMICONDUCTOR NON-VOLATILE DEVICE INCLUDING EMBEDDED NON-VOLATILE ELEMENTS

[75] Inventors: Ryan T. Hirose; Loren T. Lancaster, both of Colorado Springs, Colo.

[73] Assignee: Cypress Semiconductor Corporation, San Jose, Calif.

[21] Appl. No.: 09/136,694

[22] Filed: Aug. 19, 1998

Related U.S. Application Data

[63] Continuation-in-part of application No. 08/846,558, Apr. 29, 1997, Pat. No. 5,892,712.
[60] Provisional application No. 60/016,664, May 1, 1996.
[51] Int. Cl.[7] ................................................ G11C 16/04
[52] U.S. Cl. ............................... 365/185.01; 365/185.07; 257/315
[58] Field of Search ..................... 365/185.07, 185.01; 257/315, 321, 324

[56] References Cited

U.S. PATENT DOCUMENTS

| | | |
|---|---|---|
| 3,636,530 | 1/1972 | Mark et al. . |
| 3,676,717 | 7/1972 | Lockwood . |
| 3,950,737 | 4/1976 | Uchida et al. . |
| 4,044,343 | 8/1977 | Uchida . |
| 4,128,773 | 12/1978 | Troutman et al. . |
| 4,271,487 | 6/1981 | Craycraft et al. . |
| 4,342,101 | 7/1982 | Edwards . |
| 5,065,362 | 11/1991 | Herdt et al. . |
| 5,168,334 | 12/1992 | Mitchell et al. ........................ 257/324 |
| 5,426,605 | 6/1995 | Van Berkel et al. ..................... 365/182 |
| 5,436,480 | 7/1995 | Yu ......................................... 257/315 X |

OTHER PUBLICATIONS

Frohman–Bentchkowsky, "The metal–Nitride–Oxide–Silicon (MNOS) Transistor Characteristics and Applications", Proc. of IEEE, vol. 58, No. 8, Aug. 1970.

Donaldson, et al., "SONOS 1K X 8 Static Nonvolatile RAM," IEEE Journal of Solid–State Circuits, vol. SC–17, No 5, Oct. 1982.

*Primary Examiner*—Huan Hoang
*Attorney, Agent, or Firm*—Bradley T. Sako

[57] ABSTRACT

A bistable non-volatile latch circuit adapted to store a non-volatile binary data state during a program operation, and to assume one of two stable states in response to a recall operation that correspond uniquely to the data state has first and second circuit sections. The first circuit section has a first non-volatile current path with means to set the impedance of the first current path in a non-volatile manner. A first end of the first current path is connected to provide a logic output signal, which represents a binary logic state depending on a voltage applied to the a first signal input node. The set/reset signal to the first current path varies between at least the power source voltage and a program voltage that is negative with respect to the power source voltage. A second circuit section generates an output voltage on a second output node that represents a binary logic state opposite from the output states of the first circuit section. Means are provided for connecting the first circuit section and the second circuit section into a bistable configuration.

22 Claims, 9 Drawing Sheets

Second N-Channel Erase Bias Condition

First N-Channel Erase Bias Condition (Prior Art)

Second N-Channel Erase Bias Condition

First N-Channel Program Bias Condition (Prior Art)

Second N-Channel Program Bias Condition

First P-Channel Erase Bias Condition (Prior Art)

Second P-Channel Erase Bias Condition

First P-Channel Program Bias Condition (Prior Art)

Second P-Channel Program Bias Condition

SEMICONDUCTOR NON-VOLATILE DEVICE INCLUDING EMBEDDED NON-VOLATILE ELEMENTS

CROSS REFERENCES TO RELATED APPLICATIONS

This application is a continuation-in-part of patent application Ser. No. 08/846,558, filed Apr. 29, 1997 now U.S. Pat No. 5,892,712, which claimed priority from provisional patent application Ser. No. 60/016,664, filed May 1, 1996.

BACKGROUND OF THE INVENTION

1. Field of the Invention

This invention relates to bistable non-volatile semiconductor latches, and, more particularly, to a flip-flop circuit which includes electrically erasable, electrically programmable memory elements for setting and storing the configuration of programmable semiconductor circuitry.

2. Description of the Related Art

There is a strong need to remember the state of conditions entered or derived in semiconductor devices whenever the devices are on. These states must reliably configure the devices to act in one way or another. Examples of devices needing different configurations with the same basic device are EPLD's (Electrically Programmable Logic Devices), FPGA's (Field Programmable Gate Arrays) and memory devices that require repairing defective rows or columns of memory cells with spare or redundant rows or columns of memory cells.

Since these devices and systems have no prior knowledge of the desired conditions, non-volatile memory would be needed to store the state of conditions when the devices are turned off. When the devices are turned back on, the state of conditions are restored for proper device operation.

An array of non-volatile memory cells is a way of storing the desired conditions, but because the structure of an array of memory cells requires additional circuitry to function, simultaneous access of all states in the array is not practical. Sometimes in the EPLD case, an array of non-volatile memory cells on- or off-chip is used, and during device and system power-up, the entire content of the array is downloaded into state latches on the device which store and configure the device while it is on. The problem with this scheme is off-chip it requires more system board space and algorithms for downloading the data, and on-chip it requires a memory array with its associated overhead circuitry. Both methods require algorithms for downloading the data into state latches on-chip.

For memory devices, the above scheme is not practical, since on power-up, the memory device needs to start working right away without downloading from a non-volatile memory. Usually, memory devices incorporate fuse links to configure redundant elements and are an efficient way to implement redundancy on a memory device, but this method requires large development and production cost.

A better approach would be integrate a non-volatile latch into the configuration logic of these circuits; however, almost all manufacturable non-volatile memory elements available today require voltages during the erase and write operations that greatly exceed the typical operating voltage range of logic circuitry. In order to accommodate these higher voltages, special high voltage devices and structures must be fabricated in an integrated fashion with the standard logic devices. The additional manufacturing steps require the high voltage devices be integrated, which adds non-productive manufacturing costs to the logic, and increases logic production yield losses. Oftentimes, these two factors increase the cost of the logic well beyond what customers would be willing to accept.

Therefore a need exists to integrate non-volatile memory elements in a way that would eliminate the need for voltages significantly higher that the typical operation voltage range of the logic circuitry.

Therefore, what is needed is a method and apparatus for providing instantaneous logic configuration upon power-up when data latch devices are used to configure the state of the logic without incorporating large numbers of extra devices and manufacturing steps.

SUMMARY OF THE INVENTION

It is therefore an object of the invention to provide a semiconductor non-volatile latch which provides non-volatile data storage for logic configurability.

Another object of the invention is to provide a semiconductor non-volatile latch in which the erase operation is enabled with a lower voltage than required heretofore.

It is another object of the invention to provide a semiconductor non-volatile latch in which the write operation is enabled with a lower voltage than required heretofore.

It is still another object of the invention to provide a semiconductor non-volatile latch having an output that can be configured upon power-up or during a recall operation.

Another object of the invention is to provide a semiconductor non-volatile latch which provides full rail CMOS output levels independent of the state of the latch.

It is a further object of the invention to provide a semiconductor non-volatile latch which achieves its operation with a minimum number of additional devices over a standard cross-coupled CMOS inverter latch.

It is yet another object of the invention to provide a semiconductor non-volatile latch which consumes very little power during operation.

Yet another object of the invention is to provide a semiconductor non-volatile latch which eliminates data disturbs of the non-volatile elements during normal operation.

It is still further another object of the invention to provide a semiconductor non-volatile latch which can be produced at lower costs by reliably utilizing a dielectric charge storage.

Yet a further object of the invention is to provide a semiconductor non-volatile latch which can withstand substantial amounts of noise input while the latch is being set upon power-up or during a recall operation.

Still another object of the invention is to provide a semiconductor non-volatile latch whose non-volatile elements can be erased by the application of a negative potential to the gate of the non-volatile elements with respect to the body of the non-volatile elements.

Still yet another object of the invention is to provide a semiconductor non-volatile latch whose non-volatile elements can be programmed by the application of a positive potential to the gate of the non-volatile elements with respect to the body of the non-volatile elements while the logical low levels of the latch are taken to a negative potential.

An additional object of the invention is to provide a semiconductor non-volatile latch whose non-volatile elements can be erased and programmed by using a single negative voltage source in addition to the power supply voltage.

The above and further objects, features and advantages of the invention will become apparent from the detailed description of the preferred embodiments presented hereinafter, when read in conjunction with the accompanying drawings and appended claims.

Thus, according to the invention, there is provided a non-volatile latch, which comprises typically a CMOS latch. The CMOS latch has two CMOS inverters with the output of each CMOS inverter connected, directly or indirectly to the input of the other. Each CMOS inverter has a p-channel IGFET transistor and an n-channel IGFET transistor. The source of the p-channel transistor is connected to a logic high potential and the source and bulk of the n-channel transistor is connected to a controllable signal, $S_{rc}$, the value of which can be set within the range of Vcc to $-V_{pp}$, where $V_{cc}$ is the supply potential and $-V_{pp}$ is a negative potential with respect to the supply reference. The gates of each transistor are connected together to form the CMOS inverter input, and the drains of each transistor are connected together to form the CMOS inverter output.

In addition to the CMOS latch, the non-volatile latch has two non-volatile elements, each non-volatile element having at least an n-channel non-volatile memory transistor, each including a source node, a drain node, a gate node, a bulk region, a channel region between the source and drain nodes and lying beneath the gate region, and a charge storage layer residing between, and insulated from, the channel region and the gate region. The gates of the two non-volatile memory transistors are tied together and further to a control gate voltage generator. The bulk of the two non-volatile memory transistors are typically connected together to the controlled signal $S_{rc}$. Either the source or the drain of each of the two non-volatile memory transistors is tied uniquely to one of the drains of the transistors within the CMOS inverters of the CMOS latch.

The remaining non-volatile memory transistor source or drain node is connected to any number or other nodes to form either a static or dynamic current path to the CMOS drains. The current path through the non-volatile elements serves to provide a differential current to the CMOS inverter p-channel drains, especially during the set or reset or recall period when the non-volatile latch output is being set.

The differential current is established by setting the states of the two non-volatile memory transistors to opposite logic conditions, represented by an erased condition or a programmed condition, prior to setting the output of the non-volatile latch.

BRIEF DESCRIPTION OF THE DRAWINGS

The invention is illustrated in the accompanying drawings, in which.

DETAILED DESCRIPTION OF THE PREFERRED EMBODIMENTS

The method described herein incorporates non-volatile elements within state latches to form non-volatile latches (herein nv-latches) that power-up in the correct state, or can be reset to the correct state during a recall operation, dependent on the states stored in the non-volatile elements. Using nv-latches has the benefits of no complicated download algorithms, no system board space utilization, little on-chip area utilization, and no costly fuse-link program. Non-volatile latches are unlike nvsram cells in which data written into the SRAM part of nvsram cells are independent of what is stored in the non-volatile elements of nvsram cells. Only when necessary is data stored in non-volatile elements of nvsram cells recalled into the SRAM portion of the nvsram cells.

In contrast, the latch of the nv-latch of the invention always holds or mirrors the data stored in the non-volatile element and is never written to during the entire on-time of the nv-latch. (If different data is written into the nv-latch than what is stored, then the configuration of the device that the nv-latch is configuring will change immediately with potentially catastrophic effects. Also the different data written could put the nv-latch into an unstable condition with unwanted high operating currents one of the outcomes.)

The placement of non-volatile elements within latches to form nv-latches accomplishes certain criteria for operation. First, the non-volatile elements cause the nv-latch to power-up or be configured during a recall operation to the desired state; second, preferably zero power is consumed by the nv-latch during normal operation; third, the outputs are at CMOS levels for use by subsequent standard logic circuits; fourth, the states stored in the nv-latches do not disturb the data stored in the non-volatile elements; and fifth, the non-volatile elements are configured within the nv-latch in as efficient manner as possible so that a minimum of devices are used to form the nv-latch and that the operation is as simple as possible.

Figure 1:
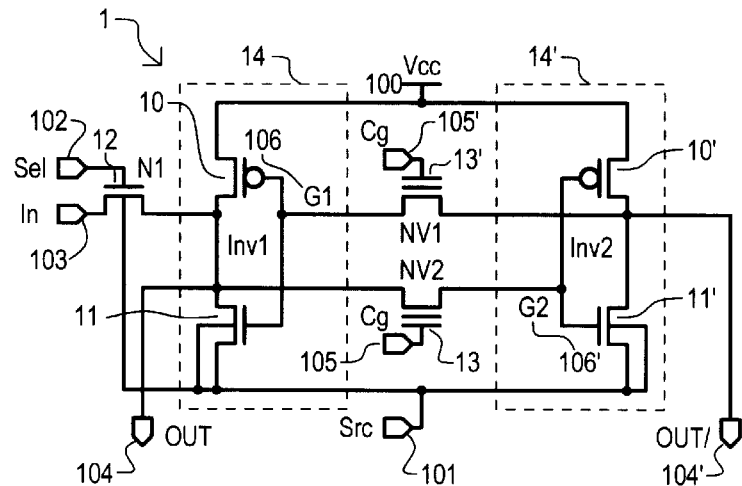
FIG. 1 shows a schematic representation of a non-volatile latch according to a preferred embodiment of the invention in which the n-channel non-volatile elements form the cross coupling path in the CMOS latch.

FIG. 1 shows an nv-latch that uses two non-volatile elements NV1 13' and NV2 13 within the gate leads of cross coupled inverters Inv1 14 and Inv2 14'. Inverters 14 and 14' include p-channel transistors 10 and 10', respectively, and n-channel transistors 11 and 11', respectively. The drains of transistors 10 and 11 are connected together and to output node 104 to supply signal Out, and likewise the drains of transistors 10' and 11' are connected together and to output node 104' to supply signal Out/.

The gates of transistors 10 and 11 are connected together and likewise the gates of transistors 10' and 11' are connected together. The source nodes of p-channel transistors 10 and 10' are tied to node 100 where the power supply level $V_{cc}$ is provided. The source and body nodes of n-channel transistors 11 and 11' along with the body of non-volatile devices 13 and 13' are connected to node 101 which supplies signal $S_{rc}$. The drain node 104 of inverter 14 is connected to a first one of two source/drain nodes of transistor 13 and the drain node 104' of inverter 14' is connected to a first one of two source/drain nodes of non-volatile device 13'. The gate node 106 of inverter 14 is connected to a second one of two source/drain nodes of transistor 13' and the gate node 106' of inverter 14' is connected to a second one of two source/drain nodes of non-volatile device 13. The gates of non-volatile devices 13 and 13' are connected together through nodes 105 and 105', respectively, to signal $C_g$.

An n-channel input selection transistor N1 12 is provided to connect an input signal In supplied to an input node 103 that is connected to the drain of transistor 12. The source of input selection transistor 12 is connected to node 104 of the latch. A select signal Sel is provided to node 102 which is connected to the gate of transistor 12 to connect the input signal on node 103 to the latch node 104. No nodes within non-volatile latch 1 are connected to the power supply reference potential.

In operation, on power-up or recall, the gates of the non-volatile elements ($C_g$ connected to nodes 105 and 105') rise, but delayed from the power supply $V_{cc}$ 100, and couple the proper nodes of the nv-latch high. The non-volatile elements have been programmed such that there is a difference in thresholds between the two devices 13 and 13'. The non-volatile element with the more negative threshold will start to couple high the input of one inverter and the output node of the second inverter before the other non-volatile elements turns on, and starts to couple the other side of the nv-latch high. The slew of the power supply potential at node 100 thus creates a differential signal at the outputs 104 and 104' of the nv-latch 1 because of the difference in the turn-on of the two non-volatile elements 13 and 13'. When there is enough differential signal coupled into the nv-latch and the power supply voltage at node 100 is higher than the larger of p-channel and n-channel thresholds, the active p-channel and n-channel devices will self amplify the differential signal to CMOS levels.

Since the basic configuration of the nv-latch is that of two cross coupled inverters 14 and 14', when the outputs 104 and 104' are at CMOS levels, the power consumed goes to zero if the voltage transferred to the gates G1 106 and G2 106' of the two inverters 14 and 14' are substantially also at CMOS levels. This will happen if the non-volatile elements 13 and 13' transfers the CMOS levels, but this is hard to do since the non-volatile elements 13 and 13' are configured as source followers. However, if one of the non-volatile elements 13 and 13' always has a positive threshold and the other always has a negative threshold, and the inverter gate that needs to go high is connected to the negative threshold device while the inverter gate that needs to go low is connected to the positive threshold device, CMOS levels can be attained at the gates 106 and 106' of the two inverters 14 and 14' when the control gate signal ($C_g$ connected to nodes 105 and 105') is ramped positively to $V_{cc}$.

Thus, according to the invention, the non-volatile latch outputs can present full CMOS rail levels of either $V_{cc}$ or the supply reference potential that properly reflect the information previously stored in the non-volatile elements while consuming very little or no current.

Figure 2:
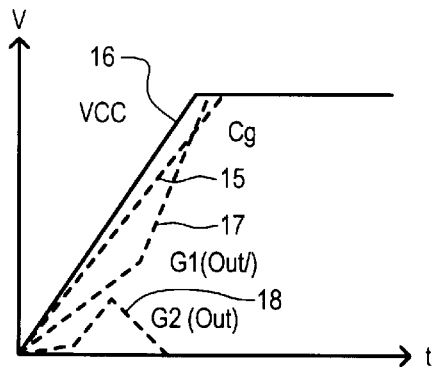
FIG. 2 illustrates the development of voltage signals $V_{cc}$, $C_g$, G1 and G2 in accordance with properly setting the output of the non-volatile latch circuit shown schematically in FIG. 1.

Referring now to FIG. 2, as signal 15 $C_g$ connected to nodes 105 and 105' ramps positively, the non-volatile element with the negative threshold, for example, NV1 13', couples the gate G1 106 of INV1 14 and the output 104' of INV2 14' (Out/) high as shown in signal 17. Thereafter, device NV2 13 with the positive threshold will turn on and also start to couple gate G2 106' of INV2 14' and the output 104 of INV1 14 (Out) high as shown in signal 18.

The differential voltage that is created can then be amplified when the power supply potential 16 supplied to node 100 is greater than the highest p-channel or n-channel threshold, and when the voltage at G1 106 is higher (referenced from ground) than the n-channel 11 threshold of Inv1 14 or the voltage at G2 106' is lower (referenced from the power supply 16) than the p-channel 10' threshold of Inv2 14', which drives the outputs signals on 104 (Out) and 104' (Out/) in opposite directions. The voltage waveforms of the power supply ($V_{cc}$) 16, $C_g$ 15, G1 17 and G2 18 are plotted against time as illustrated in FIG. 2.

Thus, the desired state of the latch output can be readily established upon applying power to the non-volatile latch circuit according to the current invention.

To program the non-volatile elements of the nv-latch shown in FIG. 1 a sequence of steps need be performed. First, the non-volatile elements 13 and 13' are erased to negative thresholds. Second, data is written into the nv-latch 1. Third, the non-volatile elements 13 and 13' are programmed using the data written into the nv-latch 1.

Though not shown in FIG. 1, NV1 13' and NV2 13 are n-channel devices and are in the same p-well node 101 as the n-channel 11 and 11' devices of INV1 14 and INV2 14'. Also, input device N1 12 is shown to be an n-channel device with the same p-well, but device N1 12 does not necessarily need to be a single n-channel device. The input means can be two devices, one connected to 104 and the other connected to 104', and can be n-channel, p-channel or other device types.

In the erase phase, control gates 105 and 105', connected to signal $C_g$, of both NV1 13' and NV2 13 are brought to a negative potential, $-V_{pp}$, and the p-well potential on node 101 at the same time is brought to the positive power supply voltage through source connection signal $S_{rc}$. This bias condition tunnels holes from the accumulated p-well surface into the storage area, and after some time (typically milliseconds) changes both thresholds to a negative value. Since the thresholds of both NV1 13' and NV2 13 are negative and signal $C_g$ is returned to the positive power supply after erasing, the nv-latch 1 can act as a normal CMOS type cross-coupled latch and the desire data state is written into the latch at this point through device N1 12 when signal Sel supplied to node 102 is high. It is important that the time lag between erasing and writing the desired data is as short as possible, since after erasure, the data state that exists within the nv-latch 1 is unknown and could degrade the erase state of NV1 13' or NV2 13.

Thus, the non-volatile elements according to the invention can be erased by establishing a voltage across the non-volatile elements by using voltages of lower magnitude than that used by conventional approaches. More specifically, according to the invention a voltage of $V_{cc}$ is placed on the p-well while $-VP_{pp}$ is placed on the gate, rather than placing a negative potential of $-V_{pp} -V_{cc}$ on the gate while the p-well and source nodes of the n-channel transistors in the latch are held at ground.

To program the data just written into the nv-latch 1, the control gates 105 and 105', connected to signal $C_g$, of NV1 13' and NV2 13 is at the positive power supply while signal $S_{rc}$ is brought to a negative potential. With $S_{rc}$ at a negative potential, the low data state in the nv-latch 1 is also at a negative potential due to the action of the latch. If a low from signal In on node 103 has been previously written into the latch, node 104' Out/ is high and 104 Out is at the negative potential.

Since signal $C_g$ connected to nodes 105 and 105' is high and signal Out/ on node 104' is high, non-volatile element NV1 13' is inhibited from being programmed and its negative threshold is preserved, but since signal Out on node 104 is at the negative potential, non-volatile element NV2 13 is programmed and its negative threshold is changed to a positive one. After a short period of time (typically milliseconds), signal $S_{rc}$ is returned to the ground potential and the voltage at 104 also returns to the ground potential preserving the state written into the latch. No sensing after programming is necessary if the nv-latch 1 stays on. On device power-up, the nv-latch 1 will be in the right state as described earlier.

Thus, according to the invention the non-volatile elements can be programmed by establishing a voltage across the non-volatile elements by using voltages of lower magnitude than that used by conventional approaches. More particularly, according to the invention, a voltage of $-V_{pp}$ is placed on the p-well while $V_{cc}$ is placed on the gate, rather than placing a positive potential of $+V_{pp}+V_{cc}$ on the gate, while the p-well and source nodes of the n-channel transistors in the latch are held at ground as provided by prior art.

Moreover, according to the invention, both the erase and program operations can be executed by using a $V_{pp}$ supply of a single negative polarity, rather than two polarities, namely $-V_{pp}$ and $+V_{pp}$, as used by prior art.

During the normal operation of the nv-latch 1 where the state of the non-volatile elements 13 and 13' are mirrored in the latch and output signals Out and Out/ on nodes 104 and 104' are driving other logic gates, the bias $C_g$ on nodes 105 and 105' and the potentials within the nv-latch 1 are such that the latch does not disturb the retention of devices NV1 13' and NV2 13.

Retention of non-volatile elements 13 an 13' will not degrade if the biases are either neutral, i.e., zero potential difference between $C_g$ and the channel potentials of non-volatile elements 13 and 13'. Alternatively, if the polarity between $C_g$ and the channels of non-volatile elements 13 and 13' reinforces the state, i.e., a programmed device that has a bias that is a program condition except with magnitudes that are much smaller. If non-volatile element NV1 13' is erased and NV2 13 is programmed, G1 106 and Out/ 104' are high, and G2 106' and Out 104 are low. $C_g$ is high during normal operation and with G1 106 and Out/ 104' high, no differential bias exist between $C_g$ on gate 105' and the channel of erased NV1 13' and retention is not adversely affected. Also, $C_g$ is high enough to turn on programmed NV2 13 (assuming a 2v to 3v threshold) so that its channel is at a ground potential and a bias exist that reinforces the program state.

Table 1 shows the biases signals and internal nodes for the normal (read), erase, write and program modes just described for nv-latch 1. Therefore, the non-volatile latch according to the invention utilizes a minimum number of additional elements over a standard latch while eliminating disturb biases during normal operation.

TABLE 1

|  | Normal | Erase | Write | Program |
| --- | --- | --- | --- | --- |
| $C_g$ | Vcc | $-V_{pp}$ | $V_{cc}$ | $V_{cc}$ |
| In | x | $V_{cc}$ | $V_{cc}/V_{ss}$ | x |
| Sel | $V_{ss}$ | x | $V_{cc}$ | $-V_{pp}$ |
| $S_{rc}$ | $V_{ss}$ | $V_{cc}$ | $V_{ss}$ | $-V_{pp}$ |
| G1, G2 | $V_{cc}/V_{ss}$ | Float | $V_{cc}/V_{ss}$ | $V_{cc}/-V_{pp}$ |
| Out, Out/ | $V_{cc}/V_{ss}$ | $V_{cc}$ | $V_{cc}/V_{ss}$ | $V_{cc}/-V_{pp}$ |

If a p-well technology is not available (p-substrate only) but n-channel non-volatile devices 13 and 13' are still desired, the potential of signal $S_{rc}$ cannot be placed at $V_{cc}$ during the erase mode and at $-V_{pp}$ during the program mode. Another method of erasing and programming the non-volatile devices is to keep the potential of $S_{rc}$ at $V_{ss}$, and increase the negative voltage on $C_g$ during an erase and increase the positive voltage on $C_g$ (and on the power supply equal to the voltage on $C_g$) during a program. This monopolar method of erasing and programming is summarized in Table 2 below.

TABLE 2

|  | Normal | Erase | Write | Program |
| --- | --- | --- | --- | --- |
| $C_g$ | $V_{cc}$ | $-V_{pp}$ | $V_{cc}$ | $V_{pp}$ |
| In | x | x | $V_{cc}/V_{ss}$ | x |
| Sel | $V_{ss}$ | $V_{ss}$ | $V_{cc}$ | $V_{ss}$ |
| $S_{rc}$ | $V_{ss}$ | $V_{ss}$ | $V_{ss}$ | $V_{ss}$ |
| G1, G2 | $V_{cc}/V_{ss}$ | Float | $V_{cc}/V_{ss}$ | $V_{pp}/V_{ss}$ |
| Out, Out/ | $V_{cc}/V_{ss}$ | $V_{cc}/V_{ss}$ | $V_{cc}/V_{ss}$ | $V_{pp}/V_{ss}$ |

Figure 3:
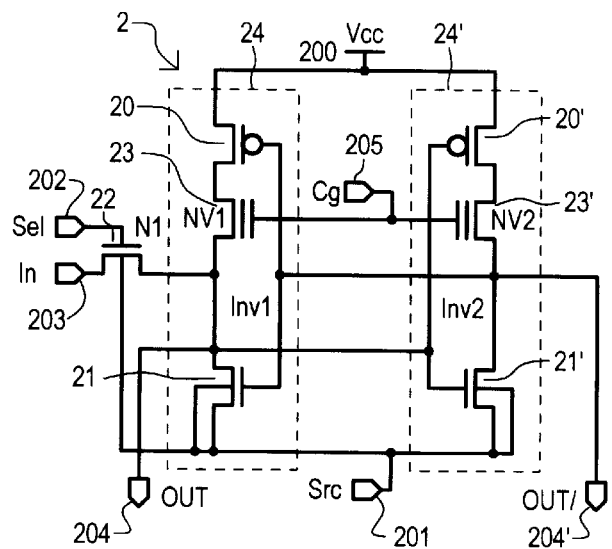
FIG. 3 shows a schematic representation of a non-volatile latch according to another preferred embodiment of the invention in which the n-channel non-volatile elements are placed between the drains of the n-channel and p-channel transistors the CMOS inverters and the non-volatile latch input and output nodes are tied to the drain of the n-channel inverter transistors.

An alternative method for implementing an nv-latch from the circuit of FIG. 1 relies on non-volatile devices being placed in series with the drain or source legs of the active CMOS devices and not in the gate leads of those devices. FIG. 3 shows nv-latch 2 that uses non-volatile devices 23 and 23' in this manner. Though not shown, the non-volatile elements, NV1 23 and NV2 23', are n-channel devices and are tied to the same p-well signal $S_{rc}$ on node 201 as the other n-channel transistors 21, 21', and 22.

Inverters 24 and 24' include p-channel transistors 20 and 20', respectively, and n-channel transistors 21 and 21', respectively. The drains of n-channel transistors 21 and 21' are connected to output nodes 204 and 204', respectively, and also to the source nodes of non-volatile devices 23 and 23', respectively. Nodes 204 and 204' also supply output signals Out and Out/, respectively. Likewise, the drains of p-channel transistors 20 and 20' are connected to the drain nodes of non-volatile devices 23 and 23', respectively. The gates of non-volatile devices 23 and 23' are connected together at node 205 where signal $C_g$ is supplied. The gates of transistors 20 and 21 are connected together to form the gate node of inverter 24, and likewise the gates of transistors 20' and 21' are connected together to form the gate node of inverter 24'.

The source nodes of p-channel transistors 20 and 20' are connected to node 200 where the power supply level $V_{cc}$ is supplied. The source and body nodes of n-channel transistors 21 and 21' along with the body of non-volatile devices 23 and 23' are connected to node 201 which supplies signal $S_{rc}$. The drain node 204 of inverter 24 is connected to the gate node of inverter 24', and the drain node 204' of inverter 24' is connected the gate node of inverter 24.

An n-channel input selection transistor N1 22 is provided to connect an input signal In supplied to an input node 203 that is connected to the drain of transistor 22. The source of input selection transistor 22 is connected to node 204 of the latch. A select signal Sel is provided to node 202 connected to the gate of transistor 22 to connect the input signal In on node 203 to the latch node 204 through transistor 22. There are no nodes within non-volatile latch 2 that are connected to the power supply reference potential.

It should be pointed out that the non-volatile elements, NV1 23 and NV2 23', are between the drain leads of the p-channel and n-channel CMOS devices in both Inv1 24 and Inv2 24', respectively. The operation of this nv-latch 2 is similar to the one described with respect to the embodiment of FIG. 1, including the power-up sequence and the program sequence of erase, write and program described above for non-volatile latch 1.

In the power-up sequence, $C_g$ supplied to node 205 couples high with the $V_{cc}$ potential on node 200 which in turn couples high the nodes of the nv-latch 2 side with the on erased non-volatile element and at some time later, determined by the slew of $V_{cc}$, the programmed non-volatile element turns on and couples high the other side of the nv-latch. As before, the differential in threshold voltage between the erased and programmed non-volatile elements causes a lag between the turn on of those elements which in turn causes a difference in magnitude of the coupled voltage to each side of the nv-latch 2 and results in a differential voltage between opposite sides of the nv-latch at nodes 204 and 204'. This differential signal is then amplified when Vcc is high enough to turn on the CMOS devices.

To erase, write and program the nv-latch 2, the exact same sequence of steps are performed as done for the circuit of FIG. 1. For a given technology, the magnitude of the biases will also be the same. As before, erasing of NV1 23 and NV2 23' are done by bringing signal $C_g$ down to a negative potential while $S_{rc}$ is at a $V_{cc}$ potential. After erasure, $C_g$ is kept high so that negative threshold non-volatile devices can pass full CMOS levels and data can be written into the nv-latch 2. Care must be taken to write data into the nv-latch 2 right after erasure so that NV1 23 or NV2 23' are not disturbed. The correct data state written in the nv-latch 2 can now be programmed into the non-volatile elements 23 and 23' simply by bringing $S_{rc}$ to a negative potential while $C_g$ is at the positive power supply potential. Table 1 also shows necessary biases for normal, erase, write and program modes for the circuit of FIG. 3.

As with the schematic of FIG. 1, the biases during the normal mode do not create disturb conditions, and with $C_g$ at a high level, CMOS levels can be maintained at the outputs. Monopolar erase and program voltages can also be utilized in the event that p-well technology is not available.

Therefore, the non-volatile elements according to the invention can be erased and programmed by establishing a voltage across the non-volatile elements by using voltages of lower magnitude than that used by conventional approaches. Also, according to the invention, both the erase and program operations can be executed by using a $V_{pp}$ supply of a single negative polarity, rather than two polarities, namely $-V_{pp}$ and $+V_{pp}$, as used by prior art. According to the non-volatile latch of the invention, the desired state of the latch output can be readily established upon applying power to the non-volatile latch circuit and that the outputs can achieve full CMOS rail levels of either $V_{cc}$ or the supply reference potential while consuming very little or no current, and that this state can be maintained during normal operation using a minimum number of additional devices over a simple latch without disturbing the state of the non-volatile elements.

Figure 4:
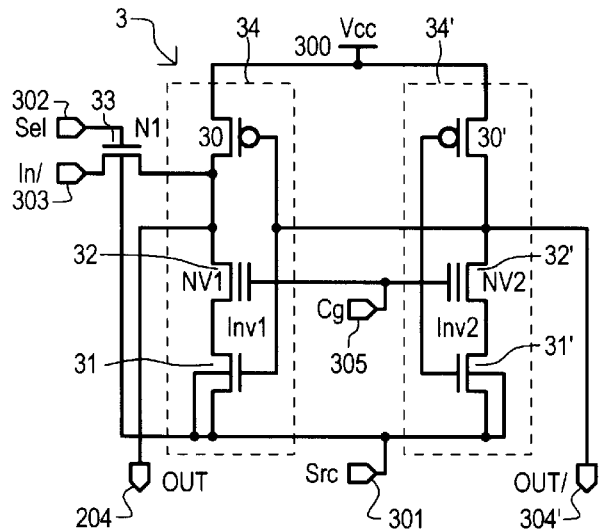
FIG. 4 shows a schematic representation of a non-volatile latch according to another preferred embodiment of the invention in which the n-channel non-volatile elements are placed between the drains of the n-channel and p-channel transistors the CMOS inverters and the non-volatile latch input and output nodes are tied to the drain of the p-channel transistors.

Shown in FIG. 4 is a variation of FIG. 3, except that data input and outputs are at nodes above the non-volatile elements. FIG. 4 shows an nv-latch 3 that uses non-volatile devices 32 and 32' in this manner. Though not shown, the non-volatile elements NV1 32 and NV2 32', are n-channel devices and are tied to the same p-well signal $S_{rc}$ on node 301 as the other n-channel transistors 31, 31', and 33.

Inverters 34 and 34' include p-channel transistors 30 and 30', respectively, and n-channel transistors 31 and 31', respectively. The drains of p-channel transistors 30 and 30' are connected to respective output nodes 304 and 304' and also to the respective drain nodes of non-volatile devices 32 and 32'. Nodes 304 and 304' also supply respective output signals Out and Out/. Likewise, the drains of n-channel transistors 31 and 31' are connected to the respective source nodes of non-volatile devices 32 and 32'. The gates of non-volatile devices 32 and 32' are connected together at node 305 where signal Cg is supplied. The gates of transistors 30 and 31 are connected together to form the gate node of inverter 34, and likewise the gates of transistors 30' and 31' are connected together to form the gate node of inverter 34'. The source nodes of p-channel transistors 30 and 30' are connected to node 300 where the power supply level $V_{cc}$ is supplied. The source and body nodes of n-channel transistors 31 and 31', along with the body of non-volatile devices 32 and 32', are connected to node 301 which supplies signal $S_{rc}$. The drain node 304 of inverter 34 is connected to the gate node of inverter 34', and the drain node 304' of inverter 34' is connected the gate node of inverter 34.

An n-channel input selection transistor N1 33 is provided to connect an input signal In/ supplied to an input node 303 that is connected to the drain of transistor 33. The source of input selection transistor 33 is connected to node 304 of the latch. A select signal Sel is provided to node 302 connected to the gate of transistor 33 to connect the input signal In/ on node 303 to the latch node 304 through transistor 33. There are no nodes within non-volatile latch 3 that are connected to the power supply reference potential.

Operation of this nv-latch 3 is different from the two previous circuits. First of all, during the power-up read and normal modes, $C_g$ is held at ground. Second, complement data is written and programmed into the latch. Third, after programming, the device will need to be powered down then up for proper true data to be read. The differences between operation of FIGS. 1 and 3 and that of FIG. 4 are all due to the outputs 304 and 304' and cross-coupling nodes being taken off the drain side of the non-volatile devices 32 and 32'. As before though, output voltage levels will go to CMOS levels, retention of the non-volatile states are not adversely affected by disturb mechanisms, and zero power is consumed during the normal operation. As before, the non-volatile elements 32 and 32' are n-channel devices connected to the same p-well signal $S_{rc}$ as the other n-channel devices 31, 31' and 33.

Since the outputs are taken above NV1 32 and NV2 32', the erased non-volatile element will produce a logic low during the power-up read at the output of its side of the nv-latch 3, but a high data state is necessary to keep the erase state during the program operation. Likewise, the programmed non-volatile element will produce a logic high at the output of its side of the nv-latch 3, but a low data state is necessary to program the non-volatile element during the program operation. For example if In/ is low during a write, Out will also be low before and after the program operation, NV1 32 will be programmed, and NV2 32' will be erased. After a power-up read, Out will be high, which is the complement of In/. The problem is that after a power-up read and a program operation the data must be the same. As a result, complement data needs to be written into this nv-latch 3 before the program operation and a read operation must be done after the program operation for true data to be present at the outputs 304 and 304' of the nv-latch 3.

In the power-up read mode, signals Sel, $S_{rc}$ and $C_g$ are held at ground while $V_{cc}$ is ramped to its operating level. When $V_{cc}$ is near the turn on of the two p-channel devices 30 and 30', both Out and Out/ start to rise, but the side with the erased non-volatile element will rise slower due to more capacitance presented by the erased non-volatile element. A differential voltage will result and when Out or Out/ (program side) rise to close to the n-channel threshold, the nv-latch 3 will self amplify the signals at the outputs 304 and 304' to CMOS levels.

The erase, write and program modes are similar to previous circuits except that data/, In/, is written into the latch. After programming, $C_g$ must be quickly brought to $V_{ss}$ to avoid disturbs. And the nv-latch 3 and all signals must be powered down and a subsequent power-up read of true data accomplished after programming.

In the previous examples of FIGS. 1 and 3, $C_g$ of NV1 and NV2 are high during the read or normal operation. This was done because during a power-up read, $C_g$ was used to couple the proper node within the nv-latch high, $C_g$ high resulted in CMOS levels at the output, and $C_g$ high also was needed for a non-disturb bias scheme within the nv-latch. For the circuit of FIG. 4, $C_g$ needs to be low during a power-up read since the nv-latch 3 side that stays low is the side that has the erased non-volatile element and $C_g$ slewing high would couple a wrong positive signal into the low side. Also, since the erased non-volatile element is on and its channel is at zero potential during the normal operation, the only potential on $C_g$ that would create a non-disturb condition is the zero potential that is in the channel. A high or low potential on $C_g$ would allow the outputs 304 and 304' to go to CMOS levels, but because of disturb biases, the only $C_g$ bias that could work for this schematic is with $C_g$ at zero potential. Table 3 shows the biases for the schematic of FIG. 4. Again, monopolar erase and program biases can be incorporated when a p-well technology is not available.

TABLE 3

|  | Normal | Erase | Write | Program |
|---|---|---|---|---|
| $C_g$ | $V_{ss}$ | $-V_{pp}$ | $V_{cc}$ | $V_{cc}$ |
| In/ | x | $V_{cc}$ | $V_{ss}/V_{cc}$ | x |
| Sel | $V_{ss}$ | x | $V_{cc}$ | $-V_{pp}$ |
| $S_{rc}$ | $V_{ss}$ | $V_{cc}$ | $V_{ss}$ | $-V_{pp}$ |
| Out, Out/ | $V_{cc}/V_{ss}$ | $V_{cc}$ | $V_{cc}/V_{ss}$ | $V_{cc}/-V_{pp}$ |

For the circuits discussed so far, the power-up read mode requires direct or indirect coupling mechanisms to read the states stored in the non-volatile elements. Though these coupling mechanisms work, the non-volatile elements do not actively steer the nv-latch nodes in a d.c. method and as a result, the nv-latch is susceptible to data destroying noise during the power-up read mode. What could happen is noise can be injected during the power-up read mode that would reduce or even change polarities of the differential signals developing as a result of coupling and wrong data could be amplified at that point. The best method to guard against noise destroying the differential signals is to configure the non-volatile elements to actively steer the nodes in the nv-latch. By using this method, developing signals that are affected by noise would quickly return to the proper state by the active non-volatile devices.

Figure 5:
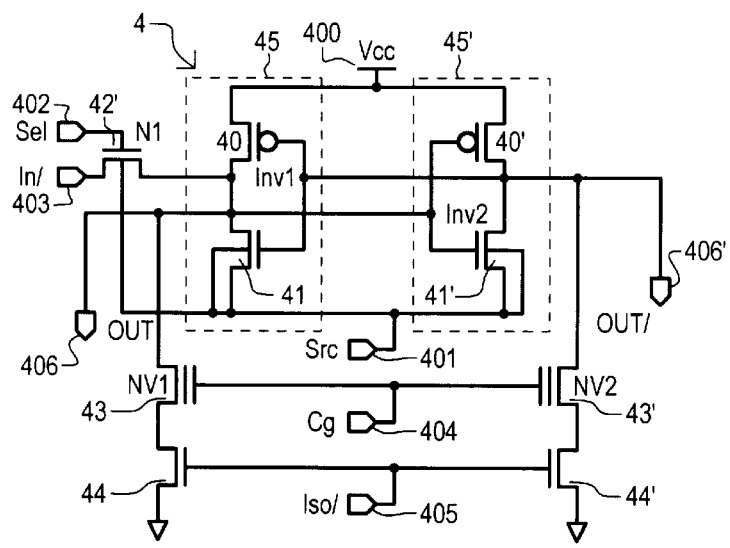
FIG. 5 shows a schematic representation of a non-volatile latch according to another preferred embodiment of the invention in which the sources of the n-channel non-volatile elements are selectively connected to or isolated from the power supply reference potential by n-channel transistors.

FIG. 5 shows a schematic that uses non-volatile elements to actively steer nodes of the nv-latch 4 to proper states during the power-up read mode through the use of additional isolating devices 44 and 44' on the source side of the non-volatile elements 43 and 43'. These isolating devices are used to isolate the nv-latch 4 nodes from ground during the erase, write and program modes, and to prevent unwanted currents during the normal operation. The non-volatile devices 43 and 43' and the isolating devices are n-channel devices that can be in the same p-well as the other n-channel devices 41 and 41' in the p-well connected to $S_{rc}$.

Inverters 45 and 45' include p-channel transistors 40 and 40', respectively, and n-channel transistors 41 and 41', respectively. The source nodes of p-channel transistors 40 and 40' are connected to node 400 where the power supply level $V_{cc}$ is supplied. The drains of p-channel transistors 40 and 40' are connected to the drains of n-channel transistors 41 and 41', respectively, and also to output nodes 406 and 406', respectively. Nodes 406 and 406' also supply output signals Out and Out/, respectively. The source and body nodes of n-channel transistors 41 and 41' are connected to node 401 which supplies signal $S_{rc}$.

The gates of transistors 40 and 41 are connected together to form the gate node of inverter 45, and likewise the gates of transistors 40' and 41' are connected together to form the gate node of inverter 45'. The drain node 406 of inverter 45 is connected to the gate node of inverter 45', and the drain node 406' of inverter 45' is connected the gate node of inverter 45.

Further, nodes 406 and 406' are connected to the drain nodes of non-volatile devices 43 and 43', respectively. The gates of non-volatile devices 43 and 43' are connected together at node 404 where signal $C_g$ is supplied. The body of non-volatile devices 43 and 43' are connected to node 401 which supplies signal $S_{rc}$. The source nodes of 43 and 43' are connected to the drain nodes of n-channel transistors 44 and 44', respectively. Transistors 44 and 44' can either isolate the source nodes of the non-volatile elements 43 and 43', respectively, or can connect the source nodes to the power supply reference potential. The source of transistors 44 and 44' are tied to the supply reference potential and the gates of transistors 44 and 44' are connected together to node 405 where signal $I_{so}/$ is supplied. An n-channel input selection transistor N1 42 is provided to connect an input signal In/ supplied to an input node 403 that is connected to the drain of transistor 42. The source of input selection transistor 42 is connected to node 406 of the latch and the body of device 42 is connected to node 401.

A select signal Sel is provided to node 402 connected to the gate of transistor 42 to connect the input signal In/ on node 403 to the latch node 406 through transistor 42. It should be pointed out that there are no nodes within the latch circuit of non-volatile latch 4 that are connected to the power supply reference potential.

As can be seen in FIG. 5, the non-volatile elements 43 and 43' provide a direct path from the output nodes 406 and 406' of the nv-latch 4 through the isolating devices 44 and 44' to ground. The latch of the nv-latch 4 is now just a simple pair of cross-coupled inverters 45 and 45' with an input device 42 gated with Sel and input from In/ for writing to the latch.

Similar to the schematic of FIG. 4 and discussed previously, the outputs 406 and 406' are taken above from drains of the non-volatile elements 43 and 43'. Because of this, complement data must be written into the nv-latch 4 for programming, and, after programming, the nv-latch 4 and its signals must be powered down and a power-up read initiated for true data to be read.

During the power-up read mode, the main difference between the schematics of FIGS. 4 and 5 is that in FIG. 5 a new signal, $I_{so}/$, that is supplied to the gate of the isolating transistors 44 and 44', is brought high with $V_{cc}$ to turn on the steering paths through the non-volatile devices 43 and 43' as soon as possible. When $V_{cc}$ rises, the output node associated with the off programmed non-volatile element will rise while the output node connected to the on erased non-volatile element will be actively held low. A differential signal between the output nodes 406 and 406' will result and amplification of that signal will occur when the high side output node approaches an n-channel threshold.

After the output nodes 406 and 406' of the nv-latch 4 have been amplified to CMOS levels, $I_{so}/$ can be brought low or left high if unwanted end-of life program current is not a concern. After a long period of time that is specified, the thresholds of the programmed non-volatile device could get close enough to zero volts for some leakage current to flow. If this current level is a concern, then the best thing to do is to bring $I_{so}/$ low during normal modes to turn off the isolating devices 44 and 44'.

During the erase, write and program modes the sequence of events and signals generated are the same as that in FIG. 4 except now $I_{so}/$ is used. During the erase and write modes, $I_{so}/$ is held low. While in the program mode, $I_{so}/$ is taken to the same negative level as the $S_{rc}$ signal to isolate both positive and negative levels within the nv-latch 4 from the ground of the isolating transistors 44 and 44'. When a p-well technology is not available, monopolar erase and program voltages can be utilized.

Figure 6:
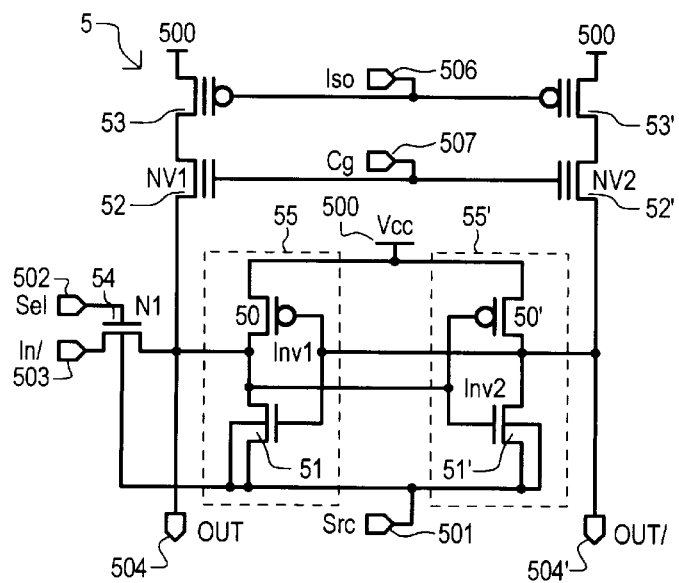
FIG. 6 shows a schematic representation of a non-volatile latch according to another preferred embodiment of the invention in which the drains of the n-channel non-volatile elements are selectively connected to or isolated from the supply potential by p-channel transistors.

Another embodiment of this invention is as shown in FIG. 6. This circuit uses simple cross-coupled inverters as in FIG. 5, but the steering non-volatile devices 52 and 52' are placed above the outputs 504 and 504' with extra isolating devices 53 and 53' placed between $V_{cc}$ and the non-volatile elements 52 and 52'. The isolating devices 53 and 53' are p-channel type with their gates connected together to node 506 where signal $I_{so}$ is supplied. Since the outputs 504 and 504' are taken from the sources of the non-volatile elements 52 and 52' that are connected to $V_{cc}$ through the drain, the data written into the nv-latch 5 is the same as that read in power-up. Therefore, no power-up read is necessary after a program.

Inverters 55 and 55' include p-channel transistors 50 and 50', respectively, and n-channel transistors 51 and 51', respectively. The source nodes of p-channel transistors 50 and 50' are connected to node 500 where the power supply level $V_{cc}$ is supplied. The drains of p-channel transistors 50 and 50' are connected to the drains of n-channel transistors 51 and 51', respectively, and also to output nodes 504 and 504', respectively.

Nodes 504 and 504' also supply output signals Out and Out/, respectively. The source and body nodes of n-channel transistors 51 and 51' are connected to node 501 which supplies signal $S_{rc}$. The gates of transistors 50 and 51 are connected together to form the gate node of inverter 55, and likewise the gates of transistors 50' and 51' are connected together to form the gate node of inverter 55'. The drain node 504 of inverter 55 is connected to the gate node of inverter 55', and the drain node 504' of inverter 55' is connected the gate node of inverter 55.

Further, nodes 504 and 504' are connected to the source nodes of non-volatile devices 52 and 52', respectively. The gates of non-volatile devices 52 and 52' are connected together at node 507 where signal $C_g$ is supplied. The body of non-volatile devices 52 and 52' are connected to node 501 which supplies signal $S_{rc}$. The drain nodes of 52 and 52' are connected to the drain nodes of p-channel transistors 53 and 53', respectively. Transistors 53 and 53' can either isolate the drain nodes of the non-volatile elements 52 and 52', respectively, or can connect the drain nodes to the power supply potential $V_{cc}$. The source of transistors 53 and 53' are tied to the supply potential $V_{cc}$ and the gates of transistors 53 and 53' are connected together to node 506 where signal $I_{so}$ is supplied.

An n-channel input selection transistor N1 54 is provided to connect an input signal In supplied to an input node 503 that is connected to the drain of transistor 54. The source of input selection transistor 54 is connected to node 504 of the latch and the body of device 54 is connected to node 501. A select signal Sel is provided to node 502 connected to the gate of transistor 54 to connect the input signal In on node 503 to the latch node 504 through transistor 54. No nodes within the non-volatile latch 5 are connected to the power supply reference potential.

In the power-up read mode, as $V_{cc}$ rises to near a p-channel threshold above ground, p-channel devices 50 and 50' of the nv-latch 5 and isolating devices 53 and 53' start to conduct and create a differential signal between the outputs 504 and 504' of the nv-latch 5 due to the erased and programmed steering non-volatile devices. When the higher output nears an n-channel threshold, the cross-coupled inverters self-amplify the differential signals to CMOS levels. Signals $S_{rc}$, Sel, In and $I_{so}$ are held to ground during the power-up read while $C_g$ is taken to the $V_{cc}$ level and left there in the normal mode so that no disturbs occur as explained with FIGS. 1 and 3.

During the normal mode, $I_{so}$ can be brought high or low as explained earlier. The erase, write and program modes is much like that of FIGS. 1 and 3 except now signal $I_{so}$ at $V_{cc}$ is used to isolate the non-volatile elements 52 and 52' from Vcc. As before, monopolar erase and program voltages can be used.

Figure 7:
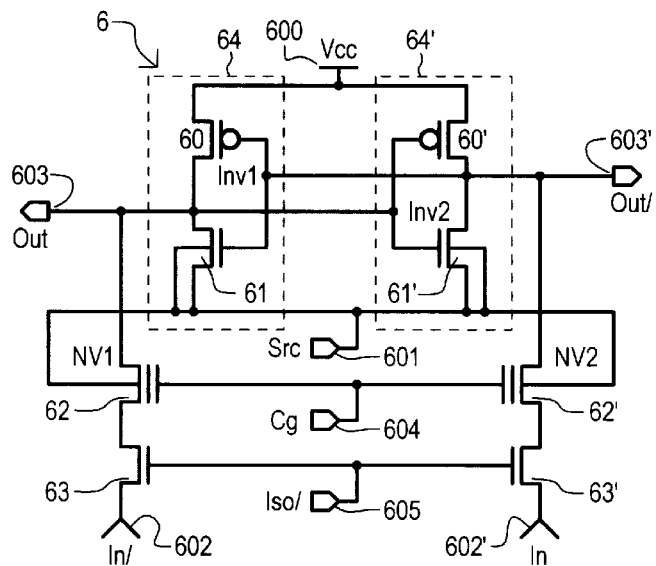
FIG. 7 shows a schematic representation of a non-volatile latch according to another preferred embodiment of the invention in which the sources of the n-channel non-volatile elements are isolated from data input lines by n-channel transistors.

In all previous nv-latch circuits, input device N1 is a single n-channel device with outputs that go directly to logic that the nv-latch is influencing. In the next two circuits are other means of inputting and/or outputting to and from the nv-latch. FIG. 7 shows an nv-latch 6 that uses two non-volatile elements NV1 62 and NV2 62' within the input leads of cross coupled inverters Inv1 64 and Inv2 64'. Inverters 64 and 64' include p-channel transistors 60 and 60', respectively, and n-channel transistors 61 and 61', respectively. The source nodes of p-channel transistors 60 and 60' are connected to node 600 where the power supply level Vcc is supplied. The drains of p-channel transistors 60 and 60' are connected to the drains of n-channel transistors 61 and 61', respectively, and also to output nodes 603 and 603', respectively. Nodes 603 and 603' also supply output signals Out and Out/, respectively. The source and body nodes of n-channel transistors 61 and 61' are connected to node 601 which supplies signal $S_{rc}$. The gates of transistors 60 and 61 are connected together to form the gate node of inverter 64, and likewise the gates of transistors 60' and 61' are connected together to form the gate node of inverter 64'. The drain node 603 of inverter 64 is connected to the gate node of inverter 64', and the drain node 603' of inverter 64' is connected the gate node of inverter 64.

Further, nodes 603 and 603' are connected to the drain nodes of non-volatile devices 62 and 62', respectively. The gates of non-volatile devices 62 and 62' are connected together at node 604 where signal $C_g$ is supplied. The body of non-volatile devices 62 and 62' is connected to node 601 which supplies signal $S_{rc}$. The source nodes of 62 and 62' are connected to the drain nodes of n-channel transistors 63 and 63', respectively. Transistors 63 and 63' can either isolate the source nodes of the non-volatile elements 62 and 62', respectively, or can connect the source nodes to respective input signals In/ and In. The source of transistors 63 and 63' are tied to nodes 602 and 602', respectively, where the input signals are supplied, and the gates of transistors 63 and 63' are connected together to node 605 where signal $I_{so}/$ is supplied.

No input selection transistor is provided since input signals In and In/ are supplied through transistors 63 and 63', thereby eliminating the need for an additional input select device. Also, there are no nodes within the non-volatile latch 6 that are connected to the power supply reference potential.

Figure 8:
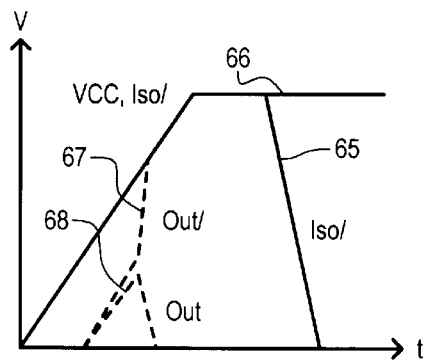
FIG. 8 illustrates the development of voltages on nodes $V_{cc}$, $I_{so}/$, Out, and Out/ in accordance with properly setting the output of the non-volatile latch circuit shown schematically in FIG. 7.

Referring now to FIG. 8, a plot of node voltages versus time shows the wave forms of the nv-latch during the power-up or recall condition. During normal operation the non-volatile elements 62 and 62' have been erased and one selectively programmed such that the threshold of the erased device is negative and that of the programmed device is positive. The theory behind this circuit is that on power-up or recall, the gates on node 605 of the input isolation devices 63 and 63' (signal 65 $I_{so}/$) rises with the power supply Vcc 66 (with $C_g$, $S_{rc}$, In and In/ held to ground) and provide a dc path to ground through devices NV1 62 and NV2 62', whichever is erased and actively holds its side of the nv-latch 6 to ground.

This creates a differential signals 67 and 68 at the outputs 603 and 603' of the nv-latch 6 because of the difference in the impedance of the two non-volatile elements 62 and 62'. When there is enough differential signal coupled into the nv-latch 6 and the power supply voltage 66 is higher than the larger of p-channel and n-channel thresholds, the active p-channel and n-channel devices will self amplify the differential signals 67 and 68 to CMOS levels. Since the basic configuration of the nv-latch 6 is that of two cross coupled inverters 64 and 64', when the outputs 67 and 68 are at CMOS levels, the power consumed goes to zero. However, if at the very end of life the threshold of the programmed non-volatile element becomes slightly depletion, an unwanted current path would exist and isolation devices 63 and 63' gated on node 605 with signal $I_{so}/$ is required to turn off the current path. These isolation devices 63 and 63' also serve to isolate the non-volatile elements 62 and 62' from In and In/ during the erase and program modes.

For the condition of device NV1 62 erased and device NV2 62' programmed, once $V_{cc}$ 66 reaches near a p-channel threshold, subthreshold current from the p-channel devices of Inv1 64 and Inv2 64' will cause Out 68 and Out/ 67 to rise. Even though device NV1 62 is erased, Out 68 can still rise depending on the relative impedance between device NV1 62 and the p-channel device 60, but Out/ 67 will rise faster since NV2 62' has a much higher impedance than NV1 61.

Once the voltage on signal Out 68 is lower than $V_{cc}$ 66 by a p-channel threshold or the voltage on Out/ 67 is higher than ground by a n-channel threshold, the cross coupled inverters 64 and 64' will self-amplify the voltages 67 and 68 to CMOS levels as shown by the change in slope of signal Out 68 and Out/ 67. Also, after signal Out 68 and Out/ 67 are at CMOS levels, $I_{so}/$ 65 can be brought low to turn off the isolation devices 63 and 63'.

To store desired states in non-volatile elements 62 and 62' of the nv-latch 6 shown in FIG. 7, a sequence of steps need be performed. First, the non-volatile elements 62 and 62' are erased to negative thresholds. Second, data is written into the nv-latch 6. And third, the non-volatile elements 62 and 62' are programmed using the data written into the nv-latch 6. In FIG. 1, device NV1 62 and device NV2 62' are n-channel devices and are in the same p-well as the n-channel devices 61 and 61' of Inv1 64 and Inv2 64'.

In the erase phase, signal $C_g$ supplied to control gate node 604, of both devices NV1 62 and NV2 62' are brought to a negative potential and the p-well potential supplied by $S_{rc}$ through node 601 is brought to the positive power supply voltage at the same time. This bias condition tunnels holes from the accumulated p-well surface into the storage area and after some time (milliseconds) changes both thresholds to a negative value. Since the thresholds of both devices NV1 62 and NV2 62' are negative and signal $C_g$ is returned to the positive power supply after erasing, the desire data state is written into the latch through the isolation devices 63 and 63' when signal $I_{so}/$ supplied to node 605 is high. It is critical that time lag between erasing and writing the desired data is as short as possible since after erasure the data state that exist within the nv-latch 6 is unknown and could degrade the erase state of devices NV1 62 or NV2 62'.

To program the data just written into the nv-latch 6, the control gate signal, $C_g$, of devices NV1 62 and NV2 62' is at the positive power supply while $S_{rc}$ and $I_{so}/$ is brought to a negative potential. With $S_{rc}$ at a negative potential, the low data state in the nv-latch 6 is also at a negative potential due to the normal action of the latch. If a low from In has been previously written into the latch, node 603' signal Out/ is at the negative potential.

Since signal $C_g$ is high and signal Out 603 is high, non-volatile element NV1 62 is inhibited from being programmed and its negative threshold is preserved, but since signal Out/ is at the negative potential, non-volatile element NV2 62' is programmed and its negative threshold is changed to a positive one. After a short period of time (milliseconds), $S_{rc}$ and $I_{so}/$ are returned to the ground potential and the voltage of Out/ also returns to the ground potential preserving the state written into the latch.

Since device NV1 62 is erased and device NV2 62' is programmed, the nv-latch 6 will power-up with Out low and Out/ high which is opposite that written during the erase/write/program store operation. Therefore, after the store operation, a power down then up must be performed to get the proper data polarity.

During the normal operation of the nv-latch 6 where the state of the non-volatile elements 62 and 62' are mirrored in the latch and outputs Out and Out/ are driving other logic gates, the biases of $C_g$ and within the nv-latch 6 is such that it does not disturb the retention of devices NV1 62 and NV262'. Retention of non-volatile elements 62 and 62' will not degrade if the biases are either neutral, i.e., zero potential difference between $C_g$ and the channel, or of the polarity to reinforce the state, i.e., a programmed device that has a bias that is a program condition except with magnitudes that are much smaller. If device NV1 62 is erased and device NV2 62' is programmed, Out is low and Out/ is high. $C_g$ is low during normal operation and with Out low, no differential bias exist between $C_g$ and the channel of erased device NV1 62 and retention is not adversely affected. Also, since $C_g$ is low and Out/ is high device NV2 62' is off and no differential bias exist between $C_g$ and substrate or channel.

Table 4 shows the biases signals and internal nodes for the normal (read), erase, write and program modes just described.

TABLE 4

|  | Normal | Erase | Write | Program |
| --- | --- | --- | --- | --- |
| $C_g$ | $V_{ss}$ | $-V_{pp}$ | $V_{cc}$ | $V_{cc}$ |
| In, In/ | x | $V_{cc}$ | $V_{cc}/V_{ss}$ | $V_{ss}$ |
| $I_{sc}/$ | $V_{ss}$ | x | $V_{cc}$ | $-V_{pp}$ |
| $S_{rc}$ | $V_{ss}$ | $V_{cc}$ | $V_{ss}$ | $-V_{pp}$ |
| Out, Out/ | $V_{cc}/V_{ss}$ | $V_{cc}$ | $V_{cc}/V_{ss}$ | $V_{cc}/-V_{pp}$ |

Figure 9:
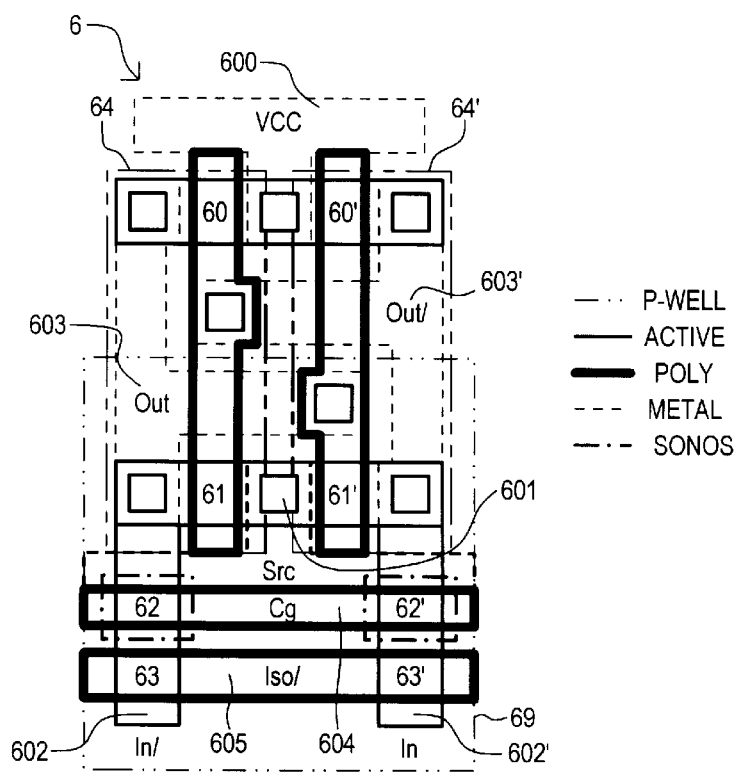
FIG. 9 shows a representative physical layout of non-volatile latch circuit shown schematically in FIG. 7.

FIG. 9 shows an example of the layout of the nv-latch 6. Notice that all n-channel devices 61, 61', 62, 62', 63, 63' are in the same p-well 69. Inputs signals In and In/ run on active runners 602 and 602' to a metal bus that is orthogonal to the active runners. This metal bus is not shown, since it is not part of the nv-latch 6 but is a part of the normal bus structure of the EPLD or FPGA. Also not shown are the $S_{rc}$ connections to the p-well 69, since these connections can be made at the ends of groups of nv-latches 6 in a row having contiguous p-wells 69.

Figure 10:
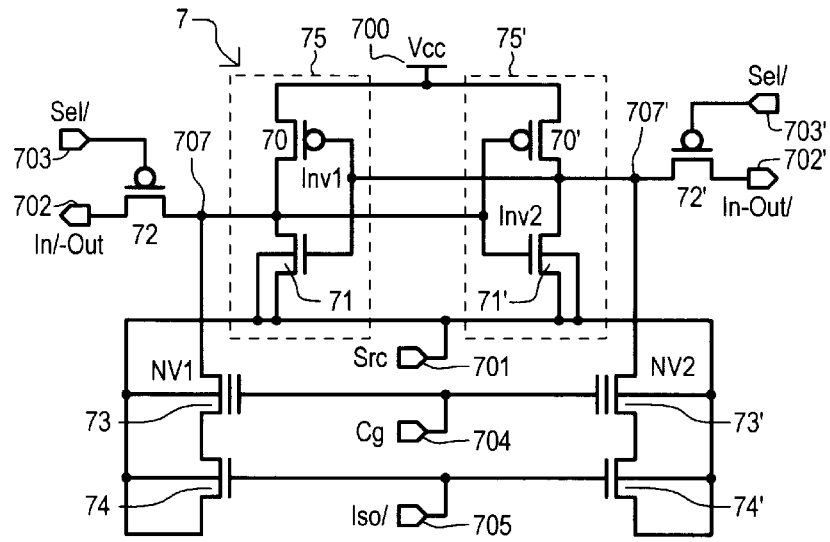
FIG. 10 shows a schematic representation of a non-volatile latch according to another preferred embodiment of the invention in which the sources of the n-channel non-volatile elements are selectively connected to or isolated from a signal $S_{rc}$ by n-channel transistors, and p-channel input/output devices are provided to the latch.

Besides using the SONOS path as the input path, another means of inputting and outputting is to use p-channel devices as shown in FIG. 10. This is done primarily to isolate the internal nodes 707 and 707' of the nv-latch 7 from input-output lines 702 and 702' that are common to more than two nv-latches of this type. The description of this latch is similar to that in FIG. 7 except a low signal on the p-channel input gates on nodes 703 and 703' are necessary when writing and reading the nv-latch 7. Also when programming, the gates 703 and 703' of the p-channel devices 72 and 72' need to be at $V_{cc}$ to turn off the path to the common input-output lines 702 and 702'.

The p-channel devices 72 and 72' can also be n-channel devices with the proper change of signal polarity on the gates. As in previous circuits, when the non-volatile devices 73 and 73' are below the output nodes 707 and 707', the polarity of the input and output signals are opposite.

Inverters 75 and 75' include p-channel transistors 70 and 70', respectively, and n-channel transistors 71 and 71', respectively. The source nodes of p-channel transistors 70 and 70' are connected to node 700 where the power supply level $V_{cc}$ is supplied. The drains of p-channel transistors 70 and 70' are connected to the drains of n-channel transistors 71 and 71', respectively, and also to output nodes 707 and 707', respectively. The source and body nodes of n-channel transistors 71 and 71' are connected to node 701 which supplies signal $S_{rc}$. The gates of transistors 70 and 71 are connected together to form the gate node of inverter 75, and likewise the gates of transistors 70' and 71' are connected together to form the gate node of inverter 75'. The drain node 707 of inverter 75 is connected to the gate node of inverter 75', and the drain node 707' of inverter 75' is connected the gate node of inverter 75.

Further, nodes 707 and 707' are connected to the respective drain nodes of non-volatile devices 73 and 73'. The gates of non-volatile devices 73 and 73' are connected together at node 704 where signal $C_g$ is supplied. The body of non-volatile devices 73 and 73' and isolation devices 74 and 74' are connected to node 701 which supplies signal $S_{rc}$. The source nodes of 73 and 73' are connected to the drain nodes of n-channel transistors 74 and 74', respectively.

Transistors 74 and 74' can either isolate the source nodes of the respective non-volatile elements 73 and 73', or can connect the source nodes to node 701 which supplies signal $S_{rc}$. The gates of transistors 74 and 74' are connected together to node 705 where signal $I_{so}/$ is supplied.

Two p-channel selection transistor 72 and 72' are provided to connect input and output signals In/-Out and In-Out/ supplied to nodes 702 and 702', respectively, at the sources of transistors 72 and 72'. The drains of selection transistors 72 and 72' are connected to nodes 707 and 707', respectively, of the latch. A select signal Sel/ is provided to nodes 703 and 703' connected to the gates of transistors 72 and 72', respectively, to connect the signals In/-Out and In-Out/ on nodes 702 and 702' to the latch nodes 707 and 707'. No nodes within the non-volatile latch 7 are connected to the power supply reference potential.

Figure 11:
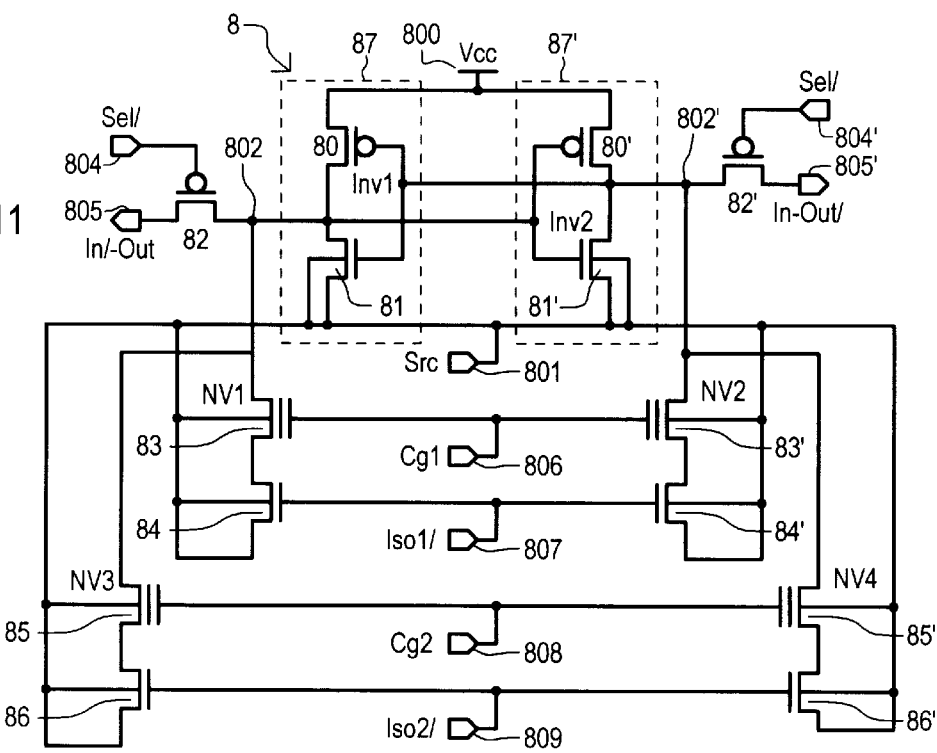
FIG. 11 shows a schematic representation of a non-volatile latch according to another preferred embodiment of the invention in which two separate configuration states are supported by two pairs of non-volatile elements, and the sources of all four n-channel non-volatile elements are selectively connected to or isolated from a signal $S_{rc}$ by n-channel transistors, and p-channel input/output devices are provided to the latch.

To all previous circuit configurations, more than a pair of non-volatile element can be added to each nv-latch to enable the nv-latch to store more than a single bit of information. For each pair of non-volatile elements added, another bit of data can be stored per nv-latch. Shown in FIG. 11 is the schematic of FIG. 10 with an extra pair of non-volatile elements and isolation devices added.

Inverters 87 and 87' include p-channel transistors 80 and 80', respectively, and n-channel transistors 81 and 81', respectively. The source nodes of p-channel transistors 80 and 80' are connected to node 800 where the power supply level $V_{cc}$ is supplied. The drains of p-channel transistors 80 and 80' are connected to the drains of n-channel transistors 81 and 81', respectively, and also to nodes 802 and 802', respectively. The source and body nodes of n-channel transistors 81 and 81' are connected to node 801 which supplies signal $S_{rc}$. The gates of transistors 80 and 81 are connected together to form the gate node of inverter 87, and likewise the gates of transistors 80' and 81' are connected together to form the gate node of inverter 87'. The drain node 802 of inverter 87 is connected to the gate node of inverter 87', and the drain node 802' of inverter 87' is connected the gate node of inverter 87.

Further, nodes 802 and 802' are connected to the drain nodes of non-volatile devices 83 and 83', respectively, and then again to the drain nodes of non-volatile devices 85 and 85'. The gates of non-volatile devices 83 and 83' are connected together at node 806 where signal $C_{g1}$ is supplied. The gates of non-volatile devices 85 and 85' are connected together at node 808 where signal $C_{g2}$ is supplied. The body of non-volatile devices 83, 83', 85, and 85' and select transistors 84, 84', 86, and 86' are connected to node 801 which supplies signal $S_{rc}$.

The source nodes of 83 and 83' are connected to the drain nodes of n-channel transistors 84 and 84', respectively. The source nodes of 85 and 85' are connected to the respective drain nodes of n-channel transistors 86 and 86'. Transistors 84, 84', 86 and 86' can either isolate the source nodes of the non-volatile elements 83, 83', 85 and 85', respectively, or can connect the source nodes to node 801 which supplies signal $S_{rc}$. The gates of transistors 84 and 84' are connected together to node 807 where signal $I_{so1}/$ is supplied. The gates of transistors 86 and 86' are connected together to node 809 where signal $I_{so2}/$ is supplied.

Two p-channel selection transistor 82 and 82' are provided to connect input and output signals In/-Out and In-Out/ supplied to nodes 805 and 805', respectively, at the sources of transistors 82 and 82'. The drains of selection transistors 82 and 82' are connected to respective nodes 802 and 802' of the latch. A select signal Sel/ is provided to nodes 804 and 804' connected to the gates of transistors 82 and 82', respectively, to connect the signals In/-Out and In-Out/ on nodes 805 and 805' to the latch nodes 802 and 802'. No nodes within the non-volatile latch 8 are connected to the power supply reference potential.

Devices NV1 83 and NV2 83' are used to store a first data state while device NV3 85 and NV4 85' are used to store another data state. Each device of each pair of non-volatile elements are connected to opposite sides of internal nodes in the nv-latch 8. Signal $C_{g1}$ goes to the gates of devices NV1 83 and NV2 83', and signal $C_{g2}$ goes to the gates of devices NV3 85 and N4 86. Signal $I_{so1}/$ goes to the gates of isolating transistors 84 and 84' for devices NV1 and NV2, and signal $I_{so2}/$ goes to the gates of isolating transistors for NV3 86 and NV4 86'.

When restoring data from devices NV1 83 and NV2 83' to the nv-latch 8, $I_{so2}/$ is low in order to cut off the current through devices NV3 85 and NV4 85'. Similarly, when restoring data from devices NV3 85 and NV4 85' to the nv-latch 8, $I_{so1}/$ is low in order to cut off the current through devices NV1 83 and NV2 83'.

Table 5 summarizes the signal biases for FIG. 11. The entries for signals $C_{g1}$, $C_{g2}$ and $I_{so1}/$, $I_{so2}/$ comes in pairs of selected value, deselected value. Signal biases for FIG. 10 can be also taken from Table 5 by assuming that $C_{g1}$ and $C_{g2}$ is $C_g$ and $I_{so1}/$ and $I_{so2}/$ is $I_{so}/$, and only the selected value is used.

TABLE 5

|  | Normal | Erase | Write | Program |
| --- | --- | --- | --- | --- |
| $C_{g1}$, $C_{g2}$ | $V_{ss}$, $V_{ss}$ | $-V_{pp}$, $V_{cc}$ | $V_{ss}$, $V_{ss}$ | $V_{cc}$, $-V_{pp}$ |
| In-Out/, In/-Out | $V_{cc}/V_{ss}$ | $V_{cc}$ | $V_{cc}/V_{ss}$ | $V_{ss}$ |
| $I_{so1}/$, $I_{so2}/$ | $V_{cc} \rightarrow V_{ss}$, $V_{ss}$ | $V_{ss}$, $V_{ss}$ | $V_{ss}$, $V_{ss}$ | $-V_{pp}$ |
| $S_{rc}$ | $V_{ss}$ | $V_{cc}$ | $V_{ss}$ | $-V_{pp}$ |
| Sel/ | $V_{cc}/V_{ss}$ | $V_{cc}$ | $V_{cc}/V_{ss}$ | $V_{cc}/-V_{pp}$ |
| Gnd | $V_{ss}$ | $V_{cc}$ | $V_{ss}$ | $V_{ss}$ |

Figure 12:
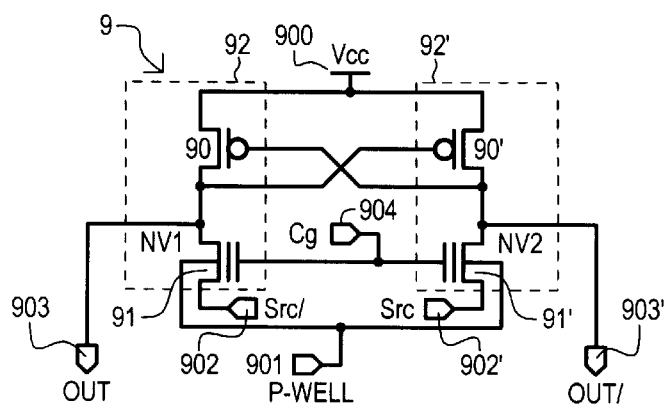
FIG. 12 shows a schematic representation of a non-volatile latch according to another preferred embodiment of the invention in which the n-channel transistors of the CMOS inverters are replaced by n-channel non-volatile devices.

A compact nv-latch embodiment of this invention uses non-volatile elements as replacements for the n-channel devices within the latch as seen in FIG. 12. Inverters 92 and 92' include p-channel transistors 90 and 90', respectively, and n-channel non-volatile transistors 91 and 91', respectively. The source nodes of p-channel transistors 90 and 90' are connected to node 900 where the power supply level $V_{cc}$ is supplied. The drains of p-channel transistors 90 and 90' are connected to the drains of n-channel non-volatile transistors 91 and 91', respectively, and also to output nodes 903 and 903', respectively. Nodes 903 and 903' also supply respective output signals Out and Out/. The source nodes of n-channel transistors 91 and 91' are connected to nodes 902 and 902', respectively. Signal $S_{rc}$ is supplied to node 902' and signal $S_{rc}/$ is supplied to node 902. The gates of non-volatile transistors 91 and 91' are connected together to node 904 where signal $C_g$ is supplied. The bulk nodes of non-volatile transistors 91 and 91' are connected to a common node 901 where the P-Well signal is supplied. The drain of transistor 90 of inverter 92 is connected to the gate transistor 90' of inverter 92', and the drain of transistor 90' of inverter 92' is connected the gate of transistor 90 of inverter 92. No nodes within the non-volatile latch 6 are connected to the power supply reference potential.

After programming, the threshold of one of the non-volatile elements is negative and the other positive. The p-channel devices 90 and 90' are cross-coupled as before but the non-volatile elements 91 and 91' have a common gate input node 904 where signal $C_g$ is provided. During normal modes of operation with $C_g$ at ground, the state of this nv-latch 9 cannot be different than that stored in the non-volatile elements 91 and 91' since only one of the non-volatile elements can actively hold its drain node low.

As before, the outputs 903 and 903' can be taken directly from the internal nodes of the nv-latch 9 or the internal nodes can be accessed from common data lines by single or double n-channel or p-channel devices. Such access devices are not shown. Without input or output access devices, programming is done by bringing a source of one of the non-volatile elements 91 or 91' to $-V_{pp}$, a negative potential with respect to the power supply reference, while the other source is at a voltage higher than $-V_{pp}$. Signal $C_g$ during programming is at $V_{cc}$. The p-well connection of each non-volatile element 91 and 91' is common and at $-V_{pp}$ during programming. For erasing, $C_g$ is brought to $-V_{pp}$ while the sources at nodes 902 and 902' and p-well node 901 of the non-volatile elements 91 and 91' are at $V_{cc}$. No nodes within the non-volatile latch 9 are connected to the power supply reference potential. Table 6 summarizes the bias scheme for the nv-latch 9 of FIG. 12.

TABLE 6

|  | Normal | Erase | Write | Program |
| --- | --- | --- | --- | --- |
| $C_g$ | $V_{ss}$ | $-V_{pp}$ | $V_{ss}$ | $V_{cc}$ |
| Out, Out/ | $V_{cc}/V_{ss}$ | $V_{cc}$ | $V_{cc}V_{ss}$ | $V_{ss}$ |
| $S_{rc}$, $S_{rc}/$ | $V_{ss}$ | $V_{cc}$ | $V_{ss}$ | $-V_{pp}$ |
| P-well | $V_{ss}$ | $V_{cc}$ | $V_{ss}$ | $-V_{pp}$ |

Figure 13:
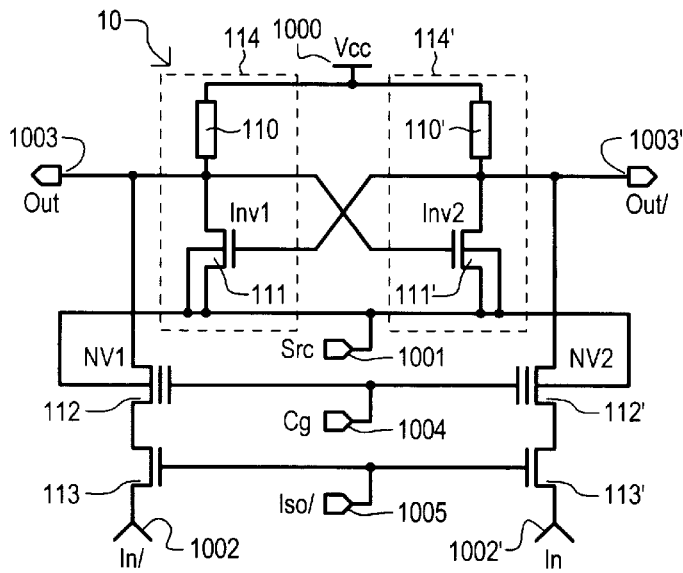
FIG. 13 shows a schematic representation of a non-volatile latch according to another preferred embodiment of the invention in which the pull-up load devices in the latch comprise high impedance devices rather than p-channel transistors.

Unlike each of the embodiments previously described, an nv-latch according to the invention can be constructed which utilizes high impedance passive pull-up elements, rather than p-channel transistors as shown in FIG. 13 for nv-latch 10. Such high impedance passive pull-up elements could comprise high resistance polysilicon resistors such as commonly used today in a building SRAM memory cells, back to back diodes which supply low level leakage current under bias, or depletion MOS devices.

Inverters 114 and 114' include high impedance passive elements 110 and 110', respectively, and n-channel transistors 111 and 111', respectively. One end of elements 110 and 110' are connected to node 1000 where the power supply level $V_{cc}$ is supplied. The other end of elements 110 and 110' are connected to the respective drains of n-channel transistors 111 and 111' and also to output respective nodes 1003 and 1003'. Nodes 1003 and 1003' also supply output signals Out and Out/, respectively.

The source and body nodes of n-channel transistors 111 and 111' are connected to node 1001 which supplies signal $S_{rc}$. The drain node 1003 of transistor 111 in inverter 114 is connected to the gate of transistor 111' in inverter 114', and the drain node 1003' of transistor 111' in inverter 114' is connected the gate node of transistor 111 in inverter 114.

Further, nodes 1003 and 1003' are connected to the drain nodes of non-volatile devices 112 and 112', respectively. The gates of non-volatile devices 112 and 112' are connected together at node 1004 where signal $C_g$ is supplied. The body of non-volatile devices 112 and 112' are connected to node 1001 which supplies signal $S_{rc}$. The source nodes of 112 and 112' are connected to the drain nodes of n-channel transistors 113 and 113', respectively. Transistors 113 and 113' can either isolate the source nodes of the non-volatile elements 112 and 112', respectively, or can connect the source nodes to input signals In/ and In, respectively.

The source of transistors 113 and 113' are tied to nodes 1002 and 1002', respectively, where the input signals are supplied, and the gates of transistors 113 and 113' are connected together to node 1005 where signal $I_{sc}/$ is supplied. No input selection transistor is provided, since input signals In and In/ are supplied through transistors 113 and 113', thereby eliminating the need for an additional input select device. No nodes within the non-volatile latch 10 are connected to the power supply reference potential.

Another embodiment looks much like a conventional SRAM cell; however, the cell select devices are replaced by non-volatile current paths which comprise non-volatile transistors. These cell select non-volatile current paths can comprise either n-channel or p-channel non-volatile transistors as discussed below. FIG. 14 shows such an n-channel non-volatile transistor under two different example erase bias conditions. The first erase bias condition in FIG. 14A represents biases that have been used in prior art and the second erase bias condition shown in FIG. 14B is representative of yet another embodiment of the current invention.

Figure 14A:
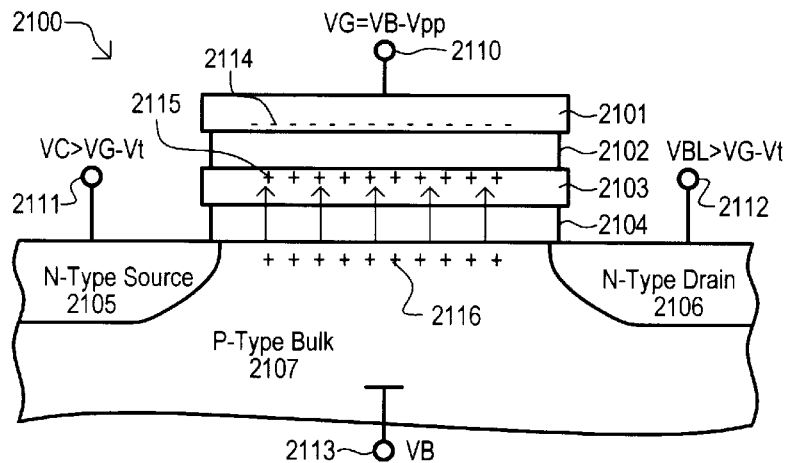
FIG. 14A shows a cross sectional view of a non-volatile n-channel transistor according to the prior art, under a first erase biasing condition.
Figure 14B:
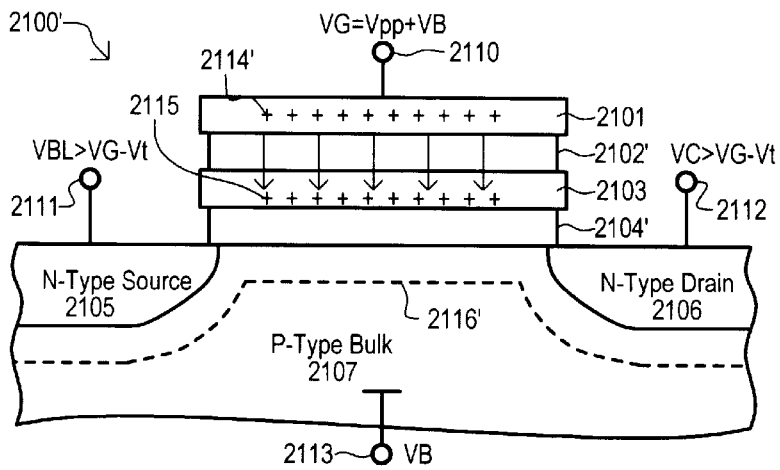
FIG. 14B shows a cross sectional view of a non-volatile n-channel transistor according to a preferred embodiment of the invention under a new and different erase bias condition.

As seen in FIG. 14A, the n-channel transistor 2100 comprises a dielectric charge storage media 2103 separated from semiconductive gate 2101 by a top dielectric layer 2102. Further, transistor 2100 comprises a p-type semiconductor bulk 2107 in which n-type source and drain junctions 2105 and 2106, respectively, are formed. Charge storage layer 2103 is separated from bulk 2107 by bottom dielectric layer 2104. The charge storage layer 2103 comprises a dielectric material capable of trapping charge carriers such as silicon nitride. Bottom dielectric layer 2104 is typically a thermally grown layer of silicon dioxide. Top dielectric layer 2102 is typically a grown or deposited layer of silicon dioxide.

Biases are applied to transistor 2100 by way of contact nodes 2110, 2111, 2112 and 2113 to the gate 2101, source 2105, drain 2106 and p-type bulk 2107, respectively. Under the erase biases shown in FIG. 14A, the gate 2101 is biased by way of contacts 2110 and 2113 to a potential substantially more negative than that of the p-type bulk 2107. Under this bias, hole accumulation layer 2116 forms just below the surface of bottom dielectric 2104 in the semiconductor bulk 2107 between the source 2105 and drain 2106 junctions. Likewise, a layer of negatively charged electrons 2114 forms just above the surface of top dielectric 2102 in gate 2101. Under this bias, positively charged holes from layer 2116 tunnel into charge storage layer 2103, leaving a net positive charge in charge storage layer 2103 after erasing. The biases applied on the source 2105 and drain 2106 during erase must be greater than a threshold voltage less than the voltage applied to the gate in order to ensure that transistor 2100 is off.

An important criteria of transistor 2100 is the selection of the thicknesses of dielectrics 2102 and 2104. Proper selection ensures that current primarily flows through bottom dielectric 2104 rather than through top dielectric 2102 while under erase bias conditions. This is achieved by selecting the thickness of the top dielectric 2102 substantially greater than that of bottom dielectric 2104. Since quantum mechanical tunneling is the primary charge transport mechanism into the charge storage layer 2103, the top dielectric 2102 thickness is typically selected to be about 20% or more greater than the bottom dielectric 2104 thickness.

In contrast, FIG. 14B shows n-channel transistor 2100' comprises a dielectric charge storage media 2103 separated from semiconductive gate 2101 by a top dielectric layer 2102'. Like transistor 2100, transistor 2100' further comprises a p-type semiconductor bulk 2107 in which n-type source and drain junctions 2105 and 2106, respectively, are formed. Charge storage layer 2103 is separated from bulk 2107 by bottom dielectric layer 2104'. The charge storage layer 2103 comprises a dielectric material capable of trapping charge carriers such as silicon nitride, silicon oxynitride, silicon-rich silicon dioxide, or a ferroelectric material. Bottom dielectric layer 2104' is typically a thermally grown layer of silicon dioxide, but can be formed using any suitable materials that exhibit dielectric properties. Top dielectric layer 2102' is typically a grown or deposited layer of silicon dioxide, however, it could be constructed by providing multiple layers of dielectric material. Optionally, transistor 2100' could include a refractory silicide layer on top of the gate 2101. Further, transistor 2100' could optionally be constructed in a P-well formed in the bulk 2107 or in a P-well nested inside an N-well, both formed in bulk 2107. In these cases, the bulk doping could be either N-type or P-type.

Biases are applied to transistor 2100' by way of contact nodes 2110, 2111, 2112 and 2113 to the gate 2101, source 2105, drain 2106 and p-type bulk 2107, respectively. Under the erase biases shown in FIG. 14B, the gate 2101 is biased by way of contacts 2110 and 2113 to a potential substantially more positive than that of the p-type bulk 2107. Under this bias, a positively charged hole layer 2114' forms just above the surface of dielectric 2102' in gate 2101 over the channel region between the source 2105 and drain 2106 junctions. Also, depletion layer 2116' forms in bulk 2107 in the channel region. Under this bias, positively charged holes from layer 2114' tunnel into charge storage layer 2103, leaving a net positive charge in charge storage layer 2103 after erasing. The biases applied on the source 2105 and drain 2106 during erase must be greater than a threshold voltage less than the voltage applied to the gate in order to ensure that transistor 2100' is off.

Like transistor 2100, an important criteria of transistor 2100' is the selection of the thicknesses of dielectrics 2102' and 2104'. Proper selection ensures that current primarily flows through top dielectric 2102' rather than through bottom dielectric 2104' while under erase bias conditions. This can be achieved by selecting the thickness of the top dielectric 2102' nearly equal to or less than that of bottom dielectric 2104'. However, most importantly, depletion layer 2116' minimizes sources of free carriers that could tunnel through bottom dielectric 2104' during the erase operation, leaving the current from gate 2101 as the dominant source of current to charge storage layer 2103.

In this way a novel n-channel non-volatile transistor is formed and biased such that it is erased by current flowing through the dielectric placed between the gate and the charge storage layer, rather than current flow through the dielectric placed between the charge storage layer and the transistor bulk.

Figure 15A:
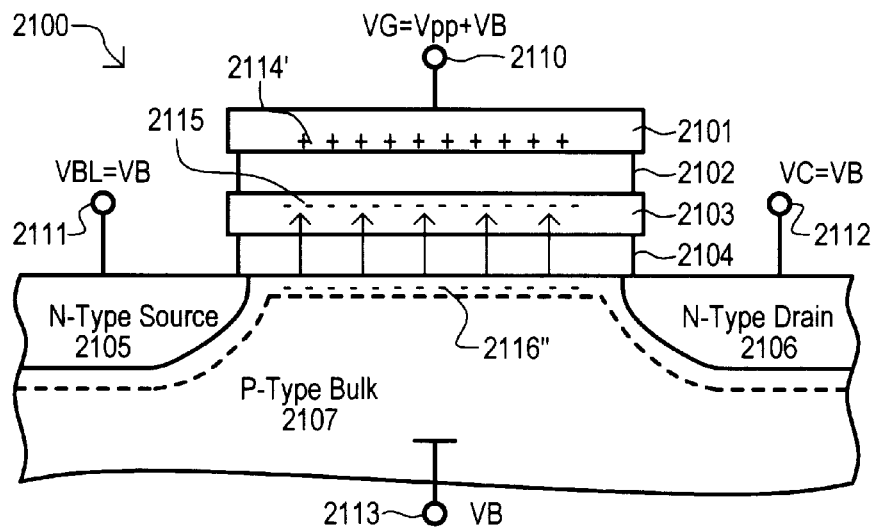
FIG. 15A shows a cross sectional view of a non-volatile n-channel transistor according to the prior art under a first program bias condition.
Figure 15B:
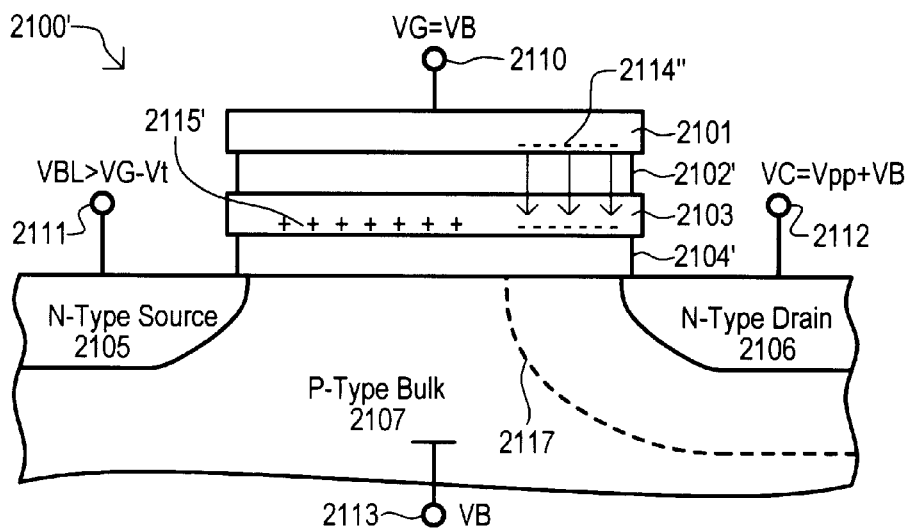
FIG. 15B shows a cross sectional view of a non-volatile n-channel transistor according to a preferred embodiment of the invention under a new and different program bias condition.

Similarly, FIG. 15 shows an n-channel non-volatile transistor under two different example program bias conditions. The first program bias condition in FIG. 15A represents biases that have been used in prior art and the second program bias condition shown in FIG. 15B is representative of yet another embodiment of the current invention.

Under the program biases shown in FIG. 15A, the gate 2101 is biased by way of contacts 2110 and 2113 to a potential substantially more positive than that of the p-type bulk 2107 and source and drain nodes 2105 and 2106. Under this bias, electron inversion layer 2116" forms just below the surface of bottom dielectric 2104 in the semiconductor bulk 2107 between the source 2105 and drain 2106 junctions. Likewise, a layer of positively charged holes 2114' forms just above the surface of top dielectric 2102 in gate 2101. Under this bias, negatively charged electrons from layer 2116" tunnel into charge storage layer 2103, leaving a net negative charge in charge storage layer 2103 after programming. The biases applied on the source 2105 and drain 2106 during programming must be set to turn on the transistor 2100 and set the potential of inversion layer 2116".

An important criteria of transistor 2100 is the selection of the thicknesses of dielectrics 2102 and 2104. Proper selection ensures that current primarily flows through bottom dielectric 2104 rather than through top dielectric 2102 while under program bias conditions. This is achieved by selecting the thickness of the top dielectric 2102 substantially greater than that of bottom dielectric 2104. Since quantum mechanical tunneling is the primary charge transport mechanism into the charge storage layer 2103, the top dielectric 2102 thickness is typically selected to be about 20% or more greater than the bottom dielectric 2104 thickness.

In contrast, FIG. 15B shows n-channel transistor 2100' under a different type of program biases. The drain 2106 is biased by way of contacts 2112, 2113 and 2110 to a potential substantially more positive than that of the p-type bulk 2107 and the gate 2101. Under this bias, depletion layer 2117 forms around drain 2106, extending just below the surface of dielectric 2104' toward the source 2105 junctions and into bulk 2107. As a result of the electric field created by depletion layer 2117, a layer of electron 2114" forms in gate 2101 just above the surface of dielectric 2102'. Under this bias, negatively charged electrons from layer 2114" tunnel into charge storage layer 2103, leaving a net negative charge in charge storage layer 2103 after programming in the vicinity of the drain junction. The charge 2115' stored in layer 2103 remains positive elsewhere. The bias applied on the source 2105 during program must be greater than a threshold voltage less than the voltage applied to the gate in order to ensure that transistor 2100' is off.

Like transistor 2100, an important criteria of transistor 2100' is the selection of the thicknesses of dielectrics 2102' and 2104'. Proper selection ensures that current primarily flows through top dielectric 2102' rather than through bottom dielectric 2104' while under program bias conditions. This is achieved by selecting the thickness of the top dielectric 2102' nearly equal to or less than that of bottom dielectric 2104'. However, most importantly, depletion layer 2117 minimizes sources of free carriers that could tunnel through bottom dielectric 2104' during the program operation, leaving the current from gate 2101 as the dominant source of charge to charge storage layer 2103.

In this way a novel n-channel non-volatile transistor is formed and biased such that it is programmed by current flow through the dielectric placed between the gate and the charge storage layer, rather than current flow through the dielectric placed between the charge storage layer and the transistor bulk.

Figure 16A:
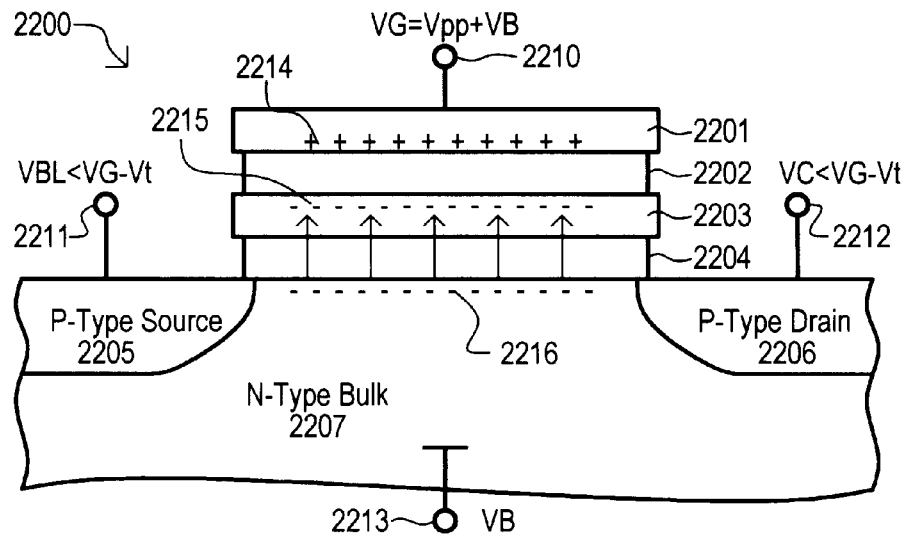
FIG. 16A shows a cross sectional view of a non-volatile p-channel transistor according to the prior art under a first erase bias condition.
Figure 16B:
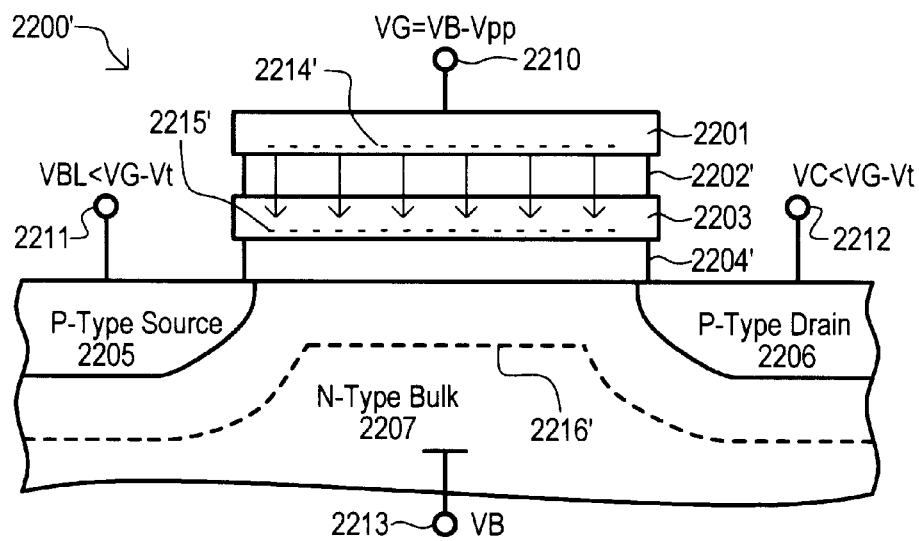
FIG. 16B shows a cross sectional view of a non-volatile p-channel transistor according to a preferred embodiment of the invention under a new and different erase bias condition.

FIG. 16 shows a p-channel non-volatile transistor under two different example erase bias conditions. The first erase bias condition in FIG. 16A represents biases that have been used in prior art and the second erase bias condition shown in FIG. 16B is representative of yet another embodiment of the current invention.

As seen in FIG. 16A, the p-channel transistor 2200 comprises a dielectric charge storage media 2203 separated from semiconductive gate 2201 by a top dielectric layer 2202. Further, transistor 2200 comprises an n-type semiconductor bulk 2207 in which p-type source and drain junctions 2205 and 2206, respectively, are formed. Charge storage layer 2203 is separated from bulk 2207 by bottom dielectric layer 2204. The charge storage layer 2203 comprises a dielectric material capable of trapping charge carriers such as silicon nitride. Bottom dielectric layer 2204 is typically a thermally grown layer of silicon dioxide. Top dielectric layer 2202 is typically a grown or deposited layer of silicon dioxide.

Biases are applied to transistor 2200 by way of contact nodes 2210, 2211, 2212 and 2213 to the gate 2201, source 2205, drain 2206 and p-type bulk 2207, respectively. Under the erase biases shown in FIG. 16A, the gate 2201 is biased by way of contacts 2210 and 2213 to a potential substantially more positive than that of the p-type bulk 2207. Under this bias, electron accumulation layer 2216 forms just below the surface of bottom dielectric 2204 in the semiconductor bulk 2207 between the source 2205 and drain 2206 junctions. Likewise, a layer of positively charged holes 2214 forms just above the surface of top dielectric 2202 in gate 2201. Under this bias, negatively charged electrons from layer 2216 tunnel into charge storage layer 2203, leaving a net negative charge in charge storage layer 2203 after erasing. The biases applied on the source 2205 and drain 2206 during erase must be less than a threshold voltage less than the voltage applied to the gate in order to ensure that transistor 2200 is off.

An important criteria of transistor 2200 is the selection of the thicknesses of dielectrics 2202 and 2204. Proper selection ensures that current primarily flows through bottom dielectric 2204 rather than through top dielectric 2202 while under erase bias conditions. This is achieved by selecting the thickness of the top dielectric 2202 substantially greater than that of bottom dielectric 2204. Since quantum mechanical tunneling is the primary charge transport mechanism into the charge storage layer 2203, the top dielectric 2202 thickness is typically selected to be about 20% or more greater than the bottom dielectric 2204 thickness.

In contrast, FIG. 16B shows p-channel transistor 2200' comprises a dielectric charge storage media 2203 separated from semiconductive gate 2201 by a top dielectric layer 2202'. Like transistor 2200, transistor 2200' further comprises an n-type semiconductor bulk 2207 in which p-type source and drain junctions 2205 and 2206, respectively, are formed. Charge storage layer 2203 is separated from bulk 2207 by bottom dielectric layer 2204'. The charge storage layer 2203 comprises a dielectric material capable of trapping charge carriers such as silicon nitride, silicon oxynitride, silicon-rich silicon dioxide, or a ferroelectric material. Bottom dielectric layer 2204' is typically a thermally grown layer of silicon dioxide, but can be formed using any suitable materials that exhibit dielectric properties. Top dielectric layer 2202' is typically a grown or deposited layer of silicon dioxide, however, it could be constructed by providing multiple layers of dielectric material. Optionally, transistor 2200' could include a refractory silicide layer on top of the gate 2201. Further, transistor 2200' could optionally be constructed in an N-well formed in the bulk 2207 or in an N-well nested inside a P-well, both formed in bulk 2207. In these cases, the bulk doping could be either N-type or P-type.

Biases are applied to transistor 2200' by way of contact nodes 2210, 2211, 2212 and 2213 to the gate 2201, source 2205, drain 2206 and p-type bulk 2207, respectively. Under the erase biases shown in FIG. 16B, the gate 2201 is biased by way of contacts 2210 and 2213 to a potential substantially more negative than that of the n-type bulk 2207. Under this bias, a negatively charged electron layer 2214' forms just above the surface of dielectric 2202' in gate 2201 over the channel region between the source 2205 and drain 2206 junctions. Also, depletion layer 2216' forms in bulk 2207 in the channel region. Under this bias, negatively charged electrons from layer 2214' tunnel into charge storage layer 2203, leaving a net negative charge in charge storage layer 2203 after erasing. The biases applied on the source 2205 and drain 2206 during erase must be less than a threshold voltage less than the voltage applied to the gate in order to ensure that transistor 2200' is off.

Like transistor 2200, an important criteria of transistor 2200' is the selection of the thicknesses of dielectrics 2202' and 2204'. Proper selection ensures that current primarily flows through top dielectric 2202' rather than through bottom dielectric 2204' while under erase bias conditions. This can be achieved by selecting the thickness of the top dielectric 2202' nearly equal to or less than that of bottom dielectric 2204'. However, most importantly, depletion layer 2216' minimizes sources of free carriers that could tunnel through bottom dielectric 2204' during the erase operation, leaving the current from gate 2201 as the dominant source of charge to charge storage layer 2203.

In this way a novel p-channel non-volatile transistor is formed and biased such that it is erased by current flow through the dielectric placed between the gate and the charge storage layer, rather than current flow through the dielectric placed between the current storage layer and the transistor bulk.

Figure 17A:
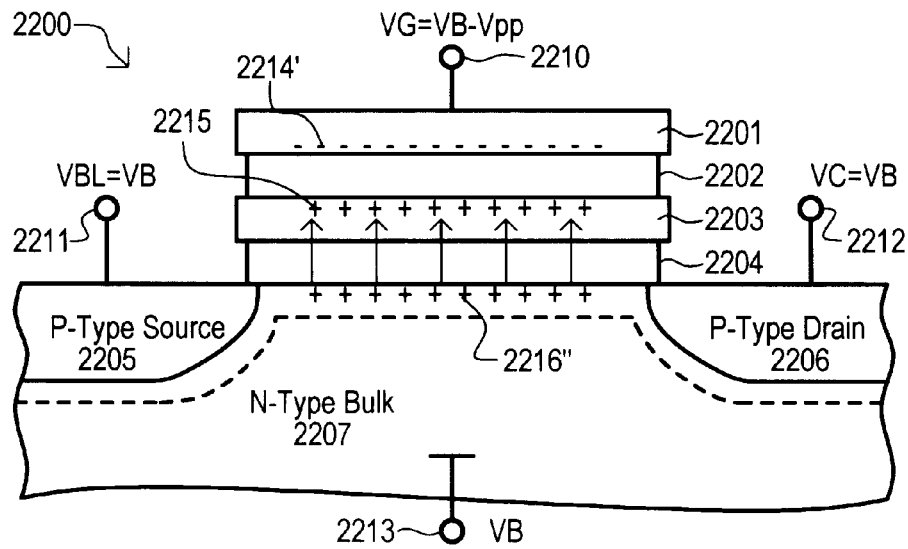
FIG. 17A shows a cross sectional view of a non-volatile p-channel transistor according to the prior art under a first program bias condition.
Figure 17B:
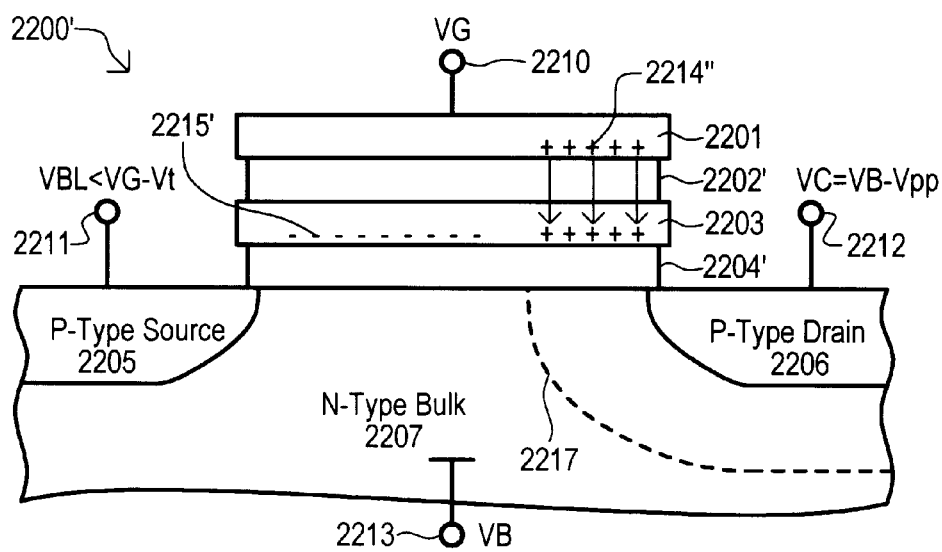
FIG. 17B shows a cross sectional view of a non-volatile p-channel transistor according to a preferred embodiment of the invention under a new and different program bias condition.

Similarly, FIG. 17 shows a p-channel non-volatile transistor under two different example program bias conditions. The first program bias condition in FIG. 17A represents biases that have been used in prior art and the second program bias condition shown in FIG. 17B is representative of the current invention.

Under the program biases shown in FIG. 17A, the gate 2201 is biased by way of contacts 2210 and 2213 to a potential substantially more negative than that of the n-type bulk 2207 and source and drain nodes 2205 and 2206. Under this bias, hole inversion layer 2216" forms just below the surface of bottom dielectric 2204 in the semiconductor bulk 2207 between the source 2205 and drain 2206 junctions. Likewise, a layer of negatively charged electrons 2214' forms just above the surface of top dielectric 2202 in gate 2201. Positively charged holes from layer 2216" tunnel into charge storage layer 2203, leaving a net positive charge in charge storage layer 2203 after programming. The biases applied on the source 2205 and drain 2206 during programming must be set to turn on the transistor 2200 and set the potential of inversion layer 2216".

An important criteria of transistor 2200 is the selection of the thicknesses of dielectrics 2202 and 2204. Proper selection ensures that current primarily flows through bottom dielectric 2204 rather than through top dielectric 2202 while under program bias conditions. This is achieved by selecting the thickness of the top dielectric 2202 substantially greater than that of bottom dielectric 2204. Since quantum mechanical tunneling is the primary charge transport mechanism into the charge storage layer 2203, the top dielectric 2202 thickness is typically selected to be about 20% or more greater than the bottom dielectric 2204 thickness.

In contrast, FIG. 17B shows p-channel transistor 2200' under a different type of program biases. The drain 2206 is biased by way of contacts 2212, 2213 and 2210 to a potential substantially more negative than that of the n-type bulk 2207 and the gate 2201. Under this bias, depletion layer 2217 forms around drain 2206, extending just below the surface of dielectric 2204' toward the source 2205 junctions and into bulk 2207. As a result of the electric field created by depletion layer 2217, a layer of holes 2214" forms in gate 2201 just above the surface of dielectric 2202'. Under this bias, positively charged holes from layer 2214" tunnel into charge storage layer 2203, leaving a net positive charge in charge storage layer 2203 after programming in the vicinity of the drain junction. The charge 2215' stored in layer 2203 remains negative elsewhere. The bias applied on the source 2205 during program must be less than a threshold voltage less than the voltage applied to the gate in order to ensure that transistor 2200' is off.

Like transistor 2200, an important criteria of transistor 2200' is the selection of the thicknesses of dielectrics 2202' and 2204'. Proper selection ensures that current primarily flows through top dielectric 2202' rather than through bottom dielectric 2204' while under program bias conditions. This is achieved by selecting the thickness of the top dielectric 2202' nearly equal to or less than that of bottom dielectric 2204'. However, most importantly, depletion layer 2217 minimizes sources of free carriers that could tunnel through bottom dielectric 2204' during the program operation, leaving the current from gate 2201 as the dominant source of current to charge storage layer 2203.

In this way a novel p-channel non-volatile transistor is formed and biased such that it is programmed by current flow through the dielectric placed between the gate and the charge storage layer, rather than current flow through the dielectric placed between the charge storage layer and the transistor bulk.

Figure 18:
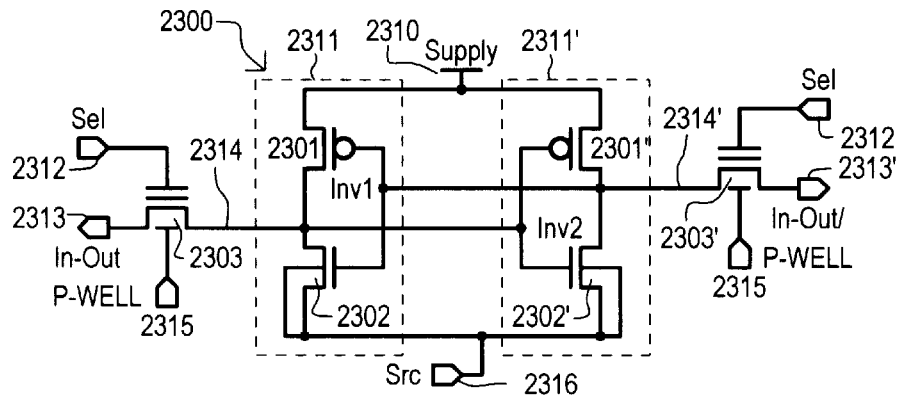
FIG. 18 shows a schematic representation of a non-volatile latch according to another preferred embodiment of the invention in which the select devices of conventional six transistor SRAM cell is replaced with the non-volatile n-channel transistor shown in FIG. 14 and FIG. 15.

FIG. 18 shows a schematic representation of an embodiment of nv-latch 2300. This embodiment uses an n-channel non-volatile current path as the input and output path. Nv-latch 2300 comprises two inverters 2311 (Inv 1) and 2311' (Inv2) that are connected to form a bistable latch. Each inverter includes four nodes; an input node, an output node, a power Supply node 2310 and a power reference node 2316, in this case connected to Src. The output of inverter 2311 is connected to the input of inverter 2311'. This common node is labeled 2314. Likewise, the output of inverter 2311' is connected to the input of inverter 2311. This common node is labeled 2314'.

A first current path comprising n-channel non-volatile transistor 2303 connects In-Out node 2313 to node 2314 and a second current path comprising n-channel non-volatile transistor 2303' connects In-Out/ node 2313' to node 2314'. The first current path is controlled by Sel node 2312 connected to the gate of transistor 2303 and the second current path is controlled by Sel node 2312 connected to the gate of transistor 2303'. Inverters 2311 and 2311' are shown to include a p-channel transistor and an n-channel transistor whose drain nodes are connected together to form the output node and whose gates are connected together to form the input node.

Inverters 2311 and 2311' could be formed by a number of different types of devices, the main objective is that the state of the output represents a stable binary logic inversion of the input. Two other embodiments include inverters that use depletion n-channel transistors or resistor loads in place of the p-channel devices. Another embodiment includes diode—rather than ohmic—connections to the output node.

The n-channel non-volatile devices act as traditional controlled input/output current paths to connect or isolate the internal nodes 2314 and 2314' of the nv-latch 2300 from input-output lines 2313 and 2313'. Like prior art n-channel input/output current paths, a high signal on the n-channel gates nodes 2312 is necessary when writing and reading the nv-latch 2300. Additionally, transistors 2303 and 2303' can store configuration information in a non-volatile fashion since they are non-volatile transistors. This configuration information can be used to configure the state of the latch.

The biases for the primary modes of operation are summarized in Table 7 below. The nv-latch 2300 is designed to allow the latch formed by inverters 2311 and 2311' to operate much like a traditional SRAM memory cell with transistors 2303 and 2303' acting as traditional select devices.

TABLE 7

|  | Erase 1 | Erase 2 | SRAM Write | SRAM Read | Program 1 | Program 2 |
| --- | --- | --- | --- | --- | --- | --- |
| Sel 2312 | −Vpp | Ground | Vcc | Vcc | Ground | Ground |
| In-Out 2313 | Ground | Ground | Data | Data | Ground | Ground |
| In-Out/2313' | Ground | Ground | Data/ | Data/ | Ground | Ground |
| Supply 2310 | Vcc | Vcc | Vcc | Vcc | Vpp | Vpp |
| Src 2316 | Ground | Ground | Ground | Ground | Ground | ~Vpp/2 |
| P-Well 2315 | Ground | −Vpp | Ground | Ground | Ground | Ground |

In "Erase 1" mode, a negative writing potential, −Vpp, is placed on gates 2312 while the P-Well 2315, input-output nodes 2313 and 2313' and Src 2316 are grounded. Supply 2310 voltage is held at Vcc in order to ensure that valid data remains in the latch during the erase operation. The negative potential on the gate 2312 erases transistors 2303 and 2303' as described above for FIG. 14A. The trapped holes shift the threshold voltage of the n-channel transistors negatively. By design, the erase threshold voltage achieved should be slightly positive, around 100 to 700 millivolts.

In "Erase 2" mode, a negative writing potential, −Vpp, is placed on P-Well 2315 while the gate nodes 2312, input-output nodes 2313 and 2313' and Src 2316 are grounded. Supply voltage 2310 is held at Vcc in order to ensure that valid data remains in the latch during the erase operation. The negative potential on the P-Well 2315 erases transistors 2303 and 2303' as described above for FIG. 14B. The trapped holes shift the threshold voltage of the n-channel transistors negatively. By design, the erase threshold voltage achieved should be slightly positive, around 100 to 700 millivolts.

In a given application, typically only one of the two erase modes in Table 7 will be used.

In "SRAM Write" mode, data can be written into the latch by respectively placing data and data/ on nodes In-Out 2313 and In-Out/ 2313' while placing select gates Sel 2312 at Vcc. Data, represented preferably by a ground potential or a Vcc potential, is placed on In-Out node 2313 while Data/, represented by the complementary choice of ground or Vcc, is placed on In-Out/ node 2313'. Biasing gates 2312 at Vcc renders transistors 2303 and 2303' conductive, providing a current path from nodes 2313 and 2313' to nodes 2314 and 2314', respectively. If the gain of transistors 2303 and 2303' are sufficient, nodes 2314 and 2314' will be charged or discharged toward the potentials on nodes 2313 and 2313', respectively, to set one of two stable data states for the nv-latch 2300.

In "SRAM Read" mode data can be read out of the latch by biasing select gates 2312 to Vcc while simultaneously allowing nodes In-Out 2313 and In-Out/ 2313' to float. Data, represented by a ground potential or a Vcc potential, will be actively held on nodes 2314 and 2314' by inverters 2311 and 2311', respectively. Biasing gates 2312 to Vcc renders transistors 2303 and 2303' conductive, providing a current path from nodes 2313 and 2313' to nodes 2314 and 2314', respectively. The potential on nodes In-Out 2313 and In-Out/ node 2313' will be driven toward the potentials held on nodes 2314 and 2314', respectively, thus providing the state of the nv-latch 2300 to external circuits for reading.

In "Program 1" mode, a positive writing potential, Vpp, is placed on Supply 2310 while the gate nodes 2312, input-output gates 2313 and 2313', Src 2316 and P-Well 2315 are grounded. Holding Supply voltage 2310 at Vpp retains the valid data state in nv-latch 2300, and therefore, places Vpp on the drain of a first of transistor, one or 2303 or 2303', while placing ground on the drain of a second transistor, the other of 2303 or 2303', in accordance with the logic polarity stored in the latch. The positive potential on the drain programs the first non-volatile transistor, as described above for FIG. 15B. The trapped electrons near the drain shifts the threshold voltage of the first n-channel transistor positively when biased with the drain acting as a source node, in other words the drain at a lower potential that the source. By design, the program threshold voltage achieved should be more positive than the erase threshold voltage. The drain of the second transistor, held at ground, creates no electric field and thus leaves the second transistor in an erased state.

"Program 2" mode biases are similar to those of the "program 1" mode except Src 2316 is held at a potential that lies between Vpp and ground, for example Vpp/2. This helps to lower the electric fields within the latch 2300. Holding Supply voltage 2310 at Vpp places Vpp on the drain of one of transistors 2303 or 2303' while placing the intermediate potential on the drain of the other transistor 2303 or 2303'. Positive Vpp potential on the drain programs the non-volatile transistor, as described above for FIG. 15B while the transistor with the intermediate potential on the drain remains erased.

In a given application, typically only one of the two program modes in Table 7 will be used.

Figure 19:
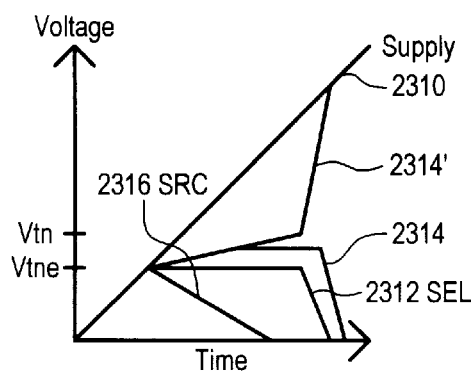
FIG. 19 illustrates the development of voltages on nodes of the nv-latch of FIG. 18 in accordance with properly setting the state of the latch circuit.

Recalling configuration information stored in transistors 2303 and 2303' to set the state of nv-latch 2300 is performed as illustrated in FIG. 19. The assumption for this illustration is that transistor 2303 is erased and transistor 2303' is programmed. Supply 2310 voltage is ramped positively along with all other nodes within nv-latch 2300. At a point in time when Supply 2310 voltage is approximately equal to the erased state threshold voltage, Sel 2312 is held nearly constant and Src 2316 is ramped toward ground. Once the difference between nodes Sel 2312 and Src 2316 is approximately equal to the erased state threshold voltage, transistor 2303 conducts to hold node 2314 constant. Node 2314' continues higher due to internal capacitive coupling. Once node 2314' reaches the threshold voltage of the n-channel device in the inverter, the latch will internally boot and the voltage differential on nodes 2314' and 2314 will be amplified to the levels on Supply 2310 and Src 2316, respectively.

Although other recall signal development methods can be used, the primary objective of the illustration in FIG. 19 it to show that configuration data stored in non-volatile transistors 2303 and 2303' is recalled by biasing nv-latch 2300 in a preferred manner. This preferred manner ensures that the junction nodes of transistors 2303 and 2303' that are connected to internal latch nodes 2314 and 2314' act as source nodes, rather than drain nodes, during the recall operation. The differing threshold voltages of programmed and erased devices 2303 and 2303' are used to develop a corresponding voltage differential on nodes 2314 and 2314' during recall. This voltage differential is amplified by the internal positive feedback system of the latch, ultimately setting the state of the nv-latch 2300 in a polarity that uniquely corresponds to the state of the data stored in a non-volatile manner in transistors 2303 and 2303'.

Accordingly, a novel nv-latch has been accomplished by replacing the n-channel select transistors of a conventional SRAM memory cell with a non-volatile current path that comprises an n-channel non-volatile transistor. The non-volatile transistor has the property of being programmable by gate current actuated by an electric field created from a depletion region about its source or drain junction. When the junction is shared with the internal nodes of the cross-coupled inverter latch of the SRAM cell, the junction bias can be selectively created by the logic state stored in the latch. The bias can then either program, or inhibit the programming of, the non-volatile transistors in accordance with the polarity of the data stored in the latch.

Figure 20:
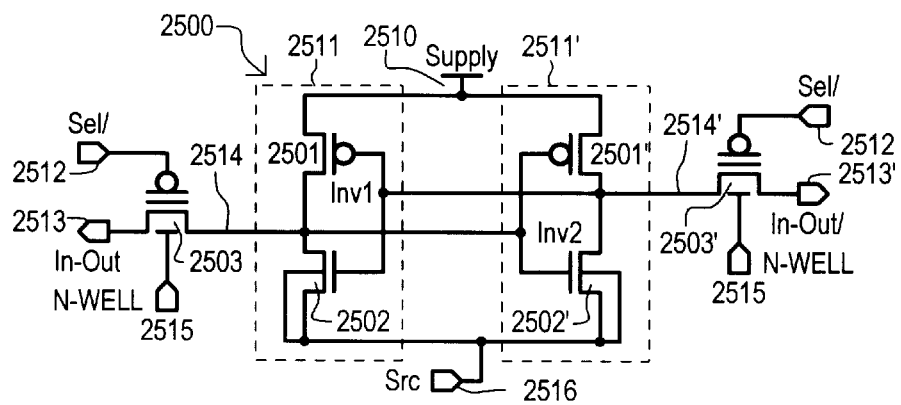
FIG. 20 shows a schematic representation of a non-volatile latch according to another preferred embodiment of the invention in which the select devices of conventional six transistor SRAM cell is replaced with the non-volatile p-channel transistor shown in FIG. 16 and FIG. 17.

The n-channel devices 2303 and 2303' of FIG. 18 can be replaced by p-channel devices with the proper change of signal polarity on the gates. FIG. 20 shows a schematic representation of an embodiment of nv-latch 2500. This embodiment uses a p-channel non-volatile current path as the input and output path. Nv-latch 2500 comprises two inverters 2511 (Inv 1) and 2511' (Inv2) that are connected to form a bistable latch. Each inverter includes four nodes; an input node, an output node, a power Supply node 2510 and a power reference node 2516, in this case connected to Src. The output of inverter 2511 is connected to the input of inverter 2511'. This common node is labeled 2514. Likewise, the output of inverter 2511' is connected to the input of inverter 2511. This common node is labeled 2514'.

A first current path comprising p-channel non-volatile transistor 2503 connects In-Out node 2513 to node 2514 and a second current path comprising p-channel non-volatile transistor 2503' connects In-Out/ node 2513' to node 2514'. The first current path is controlled by Sel/ node 2512 connected to the gate of transistor 2503 and the second current path is controlled by Sel/ node 2512 connected to the gate of transistor 2503'. Inverters 2511 and 2511' are shown to include a p-channel transistor and an n-channel transistor whose drain nodes are connected together to form the output node and whose gates are connected together to form the input node.

Inverters 2511 and 2511' could be formed by a number of different types of devices, the main objective is that the state of the output represents a stable binary logic inversion of the input. Two other embodiments include inverters that use depletion n-channel transistors or resistor loads in place of the p-channel devices. Another embodiment includes diode—rather than ohmic—connections to the output node.

The p-channel non-volatile devices act as traditional controlled input/output current paths to connect or isolate the internal nodes 2514 and 2514' of the nv-latch 2500 from input-output lines 2513 and 2513'. Unlike prior art n-channel input/output current paths, a low signal on the p-channel gates nodes 2512 is necessary when writing and reading the nv-latch 2500. Additionally, transistors 2503 and 2503' can store configuration information in a non-volatile fashion since they are non-volatile transistors. This configuration information can be used to configure the state of the latch.

The biases for the primary modes of operation are summarized in Table 8 below. The nv-latch 2500 is designed to allow the latch formed by inverters 2511 and 2511' to operate much like a traditional SRAM memory cell with transistors 2503 and 2503' acting as traditional select devices.

TABLE 8

|  | Erase 1 | Erase 2 | SRAM Write | SRAM Read | Program 1 | Program 2 |
| --- | --- | --- | --- | --- | --- | --- |
| Sel/ 2512 | Vcc + VPP | Vcc | Ground | Ground | Vcc | Vcc |
| In-Out 2513 | Vcc | Vcc | Data | Data | Vcc | Vcc |
| In-Out/ 2513' | Vcc | Vcc | Data/ | Data/ | Vcc | Vcc |
| Supply 2510 | Vcc | Vcc | Vcc | Vcc | Vcc | Ground |
| Src 2516 | Ground | Ground | Ground | Ground | Vcc-Vpp | Vcc-Vpp |
| N-Well 2515 | Vcc | Vcc + Vpp | Vcc | Vcc | Vcc | Vcc |

In "Erase 1" mode, a positive writing potential, Vcc+Vpp, is placed on gates 2512 while the N-Well 2515, input-output nodes 2513 and 2513' and Supply 2510 are held at Vcc. Src 2516 is grounded. Src 2516 voltage is held at ground in order to ensure that valid data remains in the latch during the erase operation. The positive potential on the gate 2512 erases transistors 2503 and 2503' as described above for FIG. 16A. The trapped electrons shift the threshold voltage of the p-channel transistors positively. By design, the erase threshold voltage achieved should be slightly negative, around −100 to −700 millivolts.

In "Erase 2" mode, a positive writing potential, Vcc+Vpp, is placed on N-Well 2515 while the gate nodes 2512, input-output nodes 2513 and 2513' and Supply 2510 voltage are held at Vcc. Src 2516 is held at ground in order to ensure that valid data remains in the latch during the erase operation. The positive potential on the N-Well 2515 erases transistors 2503 and 2503' as described above for FIG. 16B. The trapped electrons shift the threshold voltage of the p-channel transistors positively. By design, the erase threshold voltage achieved should be slightly negative, around −100 to −700 millivolts.

In a given application, typically only one of the two erase modes in Table 8 will be used.

In "SRAM Write" mode, data can be written into the latch by respectively placing data and data/ on nodes In-Out 2513 and In-Out/ 2513' while placing select gates Sel/ 2512 at ground. Data, represented preferably by a ground potential or a Vcc potential, is placed on In-Out node 2513 while Data/, represented by the complementary choice of ground or Vcc, is placed on In-Out/ node 2513'. Biasing gates 2512 at ground renders transistors 2503 and 2503' conductive, providing a current path from nodes 2513 and 2513' to nodes 2514 and 2514', respectively. If the gain of transistors 2503 and 2503' are sufficient, nodes 2514 and 2514' will be charged or discharged toward the potentials on nodes 2513 and 2513', respectively, to set one of two stable data states for the nv-latch 2500.

In "SRAM Read" mode data can be read out of the latch by biasing select gates 2512 to ground while simultaneously allowing nodes In-Out 2513 and In-Out/ 2513' to float. Data, represented by a ground potential or a Vcc potential, will be actively held on nodes 2514 and 2514' by inverters 2511 and 2511', respectively. Biasing gates 2512 to ground renders transistors 2503 and 2503' conductive, providing a current path from nodes 2513 and 2513' to nodes 2514 and 2514', respectively. The potential on nodes In-Out 2513 and In-Out/ node 2513' will be driven toward the potentials held on nodes 2514 and 2514', respectively, thus providing the state of the nv-latch 2500 to external circuits for reading.

In "Program 1" mode, a negative writing potential, Vcc−Vpp, is placed on Src 2516 while the gate nodes 2512, input-output gates 2513 and 2513', Supply 2510 and N-Well 2515 are set to Vcc. Holding Src voltage 2516 at Vcc−Vpp retains the valid data state in nv-latch 2500, and therefore, places Vcc−Vpp on the drain of a first transistor, one of 2503 or 2503', while placing Vcc on the drain of a second transistor, the other of 2503 or 2503', in accordance with the logic polarity stored in the latch. The negative potential on the drain programs the first non-volatile transistor, as described above for FIG. 17B. The trapped holes near the drain shifts the threshold voltage of the first p-channel transistor negatively when biased with the drain acting as a source node, in other words the drain at a higher potential that the source. By design, the program threshold voltage achieved should be more negative than the erase threshold voltage. The drain of the second transistor, held at Vcc, creates no electric field and thus leaves the second transistor in an erased state.

"Program 2" mode biases are similar to those of the "program 1" mode except Supply 2510 is held at a potential that lies between Vcc−Vpp and Vcc, for example ground. This helps to lower the electric fields within the latch 2500. Holding Src 2516 at Vcc−Vpp places Vcc−Vpp on the drain of one of transistors 2503 or 2503' while placing the intermediate potential on the drain of the other transistor 2503 or 2503'. Negative Vcc−Vpp potential on the drain programs the non-volatile transistor, as described above for FIG. 17B while the transistor with the intermediate potential on the drain remains erased.

In a given application, typically only one of the two program modes in Table 8 will be used.

Figure 21:
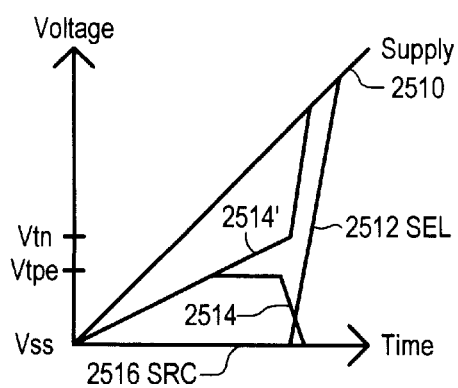
FIG. 21 illustrates the development of voltages on nodes of the nv-latch of FIG. 20 in accordance with properly setting the state of the latch circuit.

Recalling configuration information stored in transistors 2503 and 2503' to set the state of nv-latch 2500 is performed as illustrated in FIG. 21. The assumption for this illustration is that transistor 2503 is erased and transistor 2503' is programmed. Supply 2510 voltage is ramped positively while Src 2516 is held at ground. Nodes 2514 and 2514' are capacitively coupled positively by the voltage ramp on Supply 2510. At a point in time when Supply 2510 voltage is approximately equal to the erased state threshold voltage, node 2514 will be held nearly constant by conducting transistor 2503. Node 2514' will continue to rise due to internal capcitive coupling. Once node 2514' reaches the threshold voltage of the n-channel device in the inverter, the latch will internally boot and the voltage differential on nodes 2514' and 2514 will be amplified to the levels on Supply 2510 and Src 2516, respectively.

Although other recall signal development methods can be used, the primary objective of the illustration in FIG. 21 it to show that configuration data stored in non-volatile transistors 2503 and 2503' is recalled by biasing nv-latch 2500 in a preferred manner. This preferred manner ensures that the junction nodes of transistors 2503 and 2503' that are connected to internal latch nodes 2514 and 2514' act as source nodes, rather than drain nodes, during the recall operation. The differing threshold voltages of programmed and erased devices 2503 and 2503' are used to develop a corresponding voltage differential on nodes 2514 and 2514' during recall. This voltage differential is amplified by the internal positive feedback system of the latch, ultimately setting the state of the nv-latch 2500 in a polarity that uniquely corresponds to the state of the data stored in a non-volatile manner in transistors 2503 and 2503'.

Accordingly, a novel nv-latch has been accomplished by replacing the n-channel select transistors of a conventional SRAM memory cell with a non-volatile current path that comprises a p-channel non-volatile transistor. The non-volatile transistor has the property of being programmable by gate current actuated by an electric field created from a depletion region about its source or drain junction. When the junction is shared with the internal nodes of the cross-coupled inverter latch of the SRAM cell, the junction bias can be selectively created by the logic state stored in the latch. The bias can then either program, or inhibit the programming of, the non-volatile transistors in accordance with the polarity of the data stored in the latch.

Twelve different non-volatile latches have been disclosed. FIG. 1 shows cross-coupled inverters with non-volatile elements within the gate or input leads of the inverters. FIGS. 3 and 4 incorporates non-volatile elements in series with the drain leads of the p-channel or n-channel devices. In FIG. 3, the outputs are taken below the non-volatile elements, while in FIG. 4, the outputs are taken above the non-volatile elements and as a result, a power-up read must be done after a program. For FIGS. 1, 3 and 4 coupling mechanisms during power-up are used to read non-volatile data stored which present possibilities of noise disturbing the data. But in FIGS. 5 and 6, d.c. non-volatile steering devices connected to $V_{cc}$ or $V_{ss}$ through isolation devices are used to greatly lessen the effects of noise. In FIG. 5, the outputs are taken above the non-volatile elements connected to ground and thus, a program must be followed by a power-up read.

The outputs in FIG. 6 are taken below non-volatile elements connected to Vcc and no power-up read after a program is necessary. Because of noise immunity and the fact that no power-up read after program is needed, FIG. 6 is the schematic of choice for non-volatile latches. This disclosure only describes nv-latch circuits implemented with n-channel non-volatile elements, but p-channel non-volatile elements can be used by the appropriate changes of voltages in a complementary fashion. FIG. 7 shows another schematic of choice that inputs through the non-volatile elements to write the latch. FIG. 10 incorporates p-channel devices as input/output (I/O) devices and this non-volatile latch can be used when more than one nv-latch share the same output lines. The p-channel I/O devices can also be n-channel devices. FIG. 11 shows a schematic of a nv-latch similar to the one in FIG. 10 but with two pair of non-volatile elements that store two different data states. A very compact nv-latch is described with FIG. 12 and replaces the n-channel devices within the latch with non-volatile elements. Finally, FIG. 13 shows a schematic of a nv-latch that is similar to the one shown in FIG. 7 , but incorporates high impedance passive pull up elements rather than p-channel transistors in the cross coupled inverters. All nv-latches in this description can be implemented with more than one pair of non-volatile elements. FIGS. 18 and 20 show how a non-volatile latch can be constructed much like a conventional SRAM cell as long as the select transistors are replaced by non-volatile transistors that can be programmed by gate current actuated by a depletion field created about a juntion within the non-volatile transistor.

In each of the embodiments shown, one of the non-volatile current paths can be replaced by a permanent low resistance current path. The internal latch can be designed to favor one logic state upon power-up or a recall operation when the remaining non-volatile path is in a high resistance, or off, state. This is typically achieved by intentionally imbalancing the internal latch by use of geometric shapes which differ between the two inverters. When the remaining non-volatile path is in a conductive, or on, state, it is biased and sized to more than offset the intentional imbalance to create an opposite polarity imbalance.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A non-volatile semiconductor device comprising:

a semiconductor substrate;

source and drain regions in said substrate separated by a channel region;

a gate comprising at least a layer of a semiconductor material; and a multilayer gate dielectric between said gate and said channel region comprising;

a charge storage layer having alterable charge storage properties, a bottom dielectric between said charge storage layer and said channel, and a top dielectric between said charge storage layer and said gate having a thickness less than the bottom dielectric.

2. The device of claim 1 wherein said gate further comprises a layer of refractory silicide.

3. The device of claim 1 wherein said source and drain regions are doped primarily N-type.

4. The device of claim 1 wherein said source and drain regions are doped primarily P-type.

5. The device of claim 1 wherein said bottom dielectric comprises silicon dioxide.

6. The device of claim 1 wherein said top dielectric comprises silicon dioxide.

7. The device of claim 1 wherein said charge storage layer comprises a dielectric material capable of trapping charge.

8. The device of claim 1 wherein said charge storage layer comprises a material selected from the group consisting of silicon nitride; silicon oxynitride, silicon-rich silicon dioxide, and ferroelectric materials.

9. The device of claim 1 wherein said substrate has a first conductivity type and said source and drain regions are semiconductor regions of a second conductivity type.

10. The device of claim 1 where said substrate has a first conductivity type and said source and drain regions are semiconductor regions of a first conductivity type; and said non-volatile semiconductor device further comprising a first well region of a second conductivity type in said substrate surrounding at least said source and drain regions and said channel region.

11. The device of claim 1 wherein said substrate has a first conductivity type and said source and drain regions are semiconductor regions of a second conductivity type;

said non-volatile semiconductor device further comprising:

a first well region of a first conductivity type in said substrate surrounding as least said source, drain, and channel regions; and an additional second well region of the second conductivity type formed in said substrate surrounding at least said first well region.

12. A semiconductor device, comprising:

a first non-volatile semiconductor device comprising a multilayer gate dielectric having a first dielectric, a second dielectric with a thickness treater than the first dielectric, and an intermediate charge storage layer between the first and second dielectrics, the first non-volatile semiconductor device including a controllable impedance path coupled to a first input node of a circuit having at least two stable states.

13. The semiconductor device of claim 12, wherein:

the circuit includes cross-coupled transistors of complementary conductivity.

14. The semiconductor device of claim 12, wherein:

the circuit includes the first input node, a second input node, a first transistor coupled between the first input node and a first supply node having a control terminal coupled the second input node, a second transistor coupled between the second input node and the first supply node having a control terminal coupled to the first input node.

15. The semiconductor device of claim 12, further including:

a second non-volatile semiconductor device comprising a multilayer gate dielectric having a first dielectric, a second dielectric with a thickness greater than the first dielectric, and an intermediate charge storage layer between the first and second dielectrics, the second non-volatile semiconductor device including a controllable impedance path coupled to a second input node of the circuit.

16. A method of transferring data to a circuit, comprising:

providing a non-volatile semiconductor device with a top dielectric having a thickness less than a bottom dielectric and biasing the circuit to create a programming current from a gate of the non-volatile semiconductor device through the top dielectric to a charge storage layer.

17. The method of claim 16, wherein:

a normal operating voltage is supplied to the circuit at a first node and a second node and biasing the circuit includes creating a programming voltage between the first node and the gate of the non-volatile semiconductor device, the programming voltage being greater than the normal operating voltage.

18. The method of claim 17, wherein:

biasing the circuit includes biasing the second node and the gate of the non-volatile semiconductor device to the same potential.

19. The method of claim 16, wherein:

biasing the circuit includes forming a depletion region in a substrate below a portion of the charge storage layer.

20. A method of shifting the threshold voltage of a non-volatile semiconductor device, comprising:

providing a non-volatile semiconductor device with a top dielectric having a thickness less than a bottom dielectric, forming a depletion region in a substrate beneath at least a portion of a non-volatile semiconductor device gate and passing current from said gate through the top dielectric into an intermediate dielectric formed over the depletion region between the first dielectric and the second dielectric.

21. The method of claim 20, wherein:

forming a depletion region includes creating a voltage difference between the substrate and a non-volatile semiconductor device node.

22. The method of claim 20, wherein:

the non-volatile semiconductor device comprises a field effect transistor.

* * * * *